(12) United States Patent
Maniwa et al.

(10) Patent No.: US 8,836,432 B2
(45) Date of Patent: Sep. 16, 2014

(54) AMPLIFIER

(71) Applicant: Fujitsu Limited, Kawasaki (JP)

(72) Inventors: Toru Maniwa, Setagaya (JP);
Shigekazu Kimura, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/740,252

(22) Filed: Jan. 13, 2013

(65) Prior Publication Data

US 2013/0222058 A1 Aug. 29, 2013

(30) Foreign Application Priority Data

Feb. 29, 2012 (JP) .................. 2012-044784

(51) Int. Cl.
*H03F 3/04* (2006.01)
(52) U.S. Cl.
USPC ............................. 330/302; 330/306; 330/277
(58) Field of Classification Search
USPC .......................................... 330/302, 306, 277
IPC .......................................................... H03F 3/04
See application file for complete search history.

(56) References Cited

U.S. PATENT DOCUMENTS

| 6,535,069 B2* | 3/2003 | Fujioka et al. | 330/302 |
| 7,161,434 B2* | 1/2007 | Rhodes | 330/302 |
| 7,202,734 B1* | 4/2007 | Raab | 330/126 |
| RE42,612 E * | 8/2011 | Grundingh | 330/251 |
| 2010/0079211 A1* | 4/2010 | Matsuda et al. | 330/306 |
| 2011/0025412 A1 | 2/2011 | Matsunaga | |

FOREIGN PATENT DOCUMENTS

| JP | 2002-510927 | 4/2002 |
| JP | 2009-213090 | 9/2009 |
| JP | 2010-268248 | 11/2010 |
| KR | 10-0984079 B1 | 9/2010 |
| WO | WO-99/52206 | 10/1999 |
| WO | WO-2009/131138 | 10/2009 |

OTHER PUBLICATIONS

Korean Office Action mailed Oct. 28, 2013 for corresponding Korean Application No. 10-2012-0137743, with Partial English-language Translation.

* cited by examiner

*Primary Examiner* — Patricia Nguyen
(74) *Attorney, Agent, or Firm* — Fujitsu Patent Center

(57) ABSTRACT

An amplifier includes an amplifying element that amplifies an input signal; an output terminal that outputs the signal amplified by the amplifying element; a matching circuit disposed in series between the amplifying element and the output terminal, and performing impedance matching; an impedance converter disposed in series between the amplifying element and the matching circuit or between the matching circuit and the output terminal; and a first resonator and a second resonator connected at the ends of the impedance converter.

12 Claims, 21 Drawing Sheets

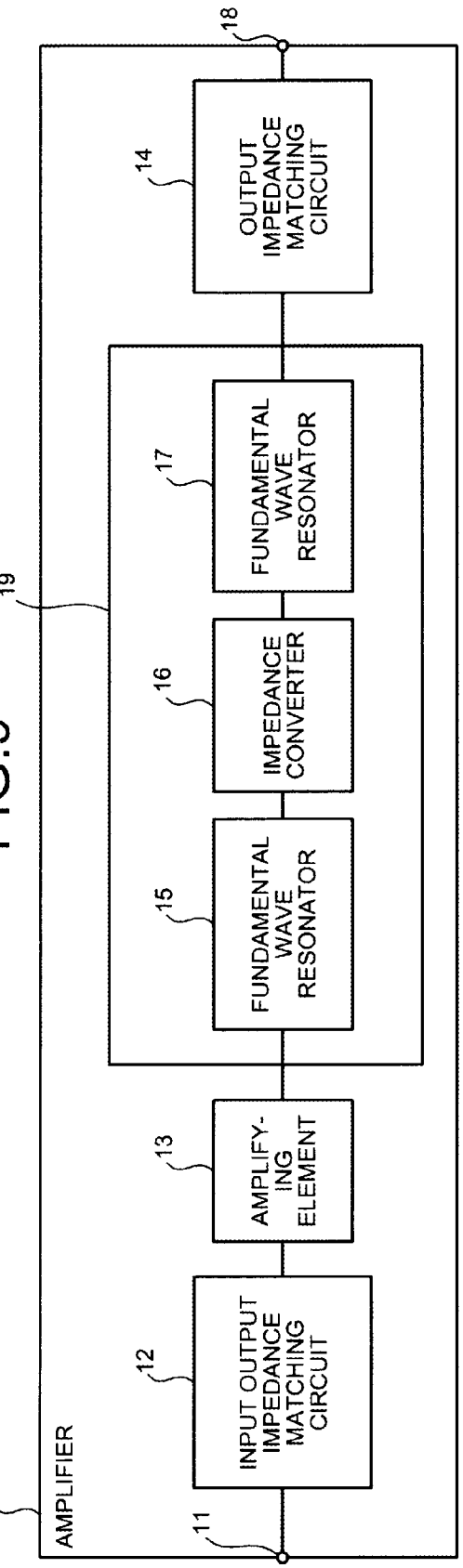

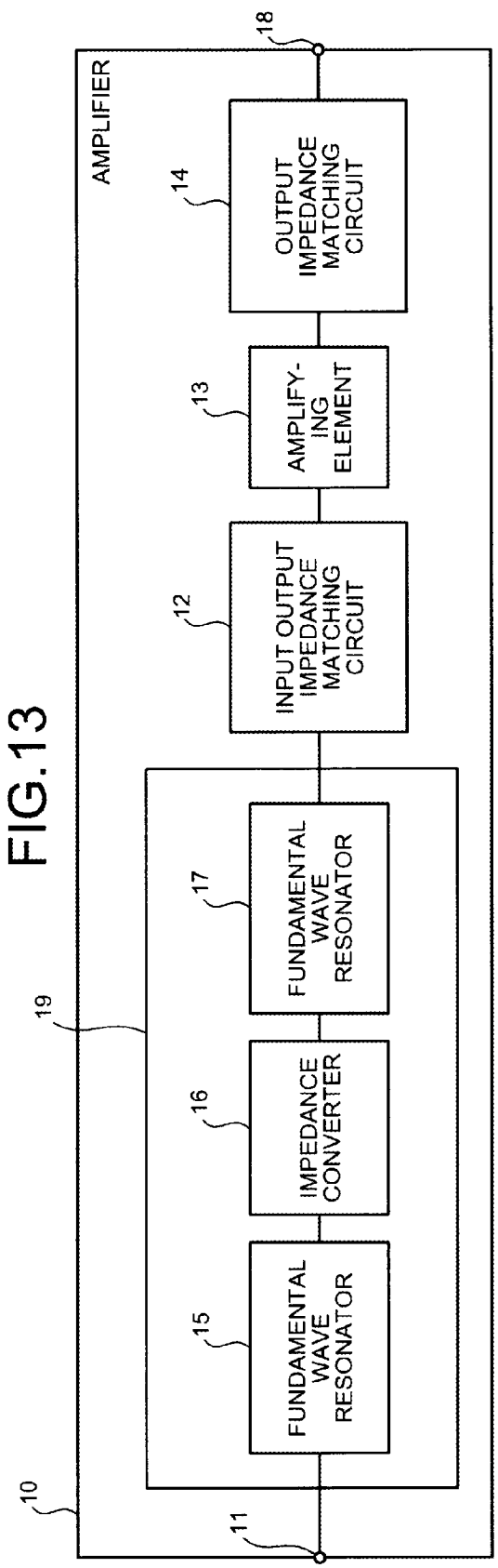

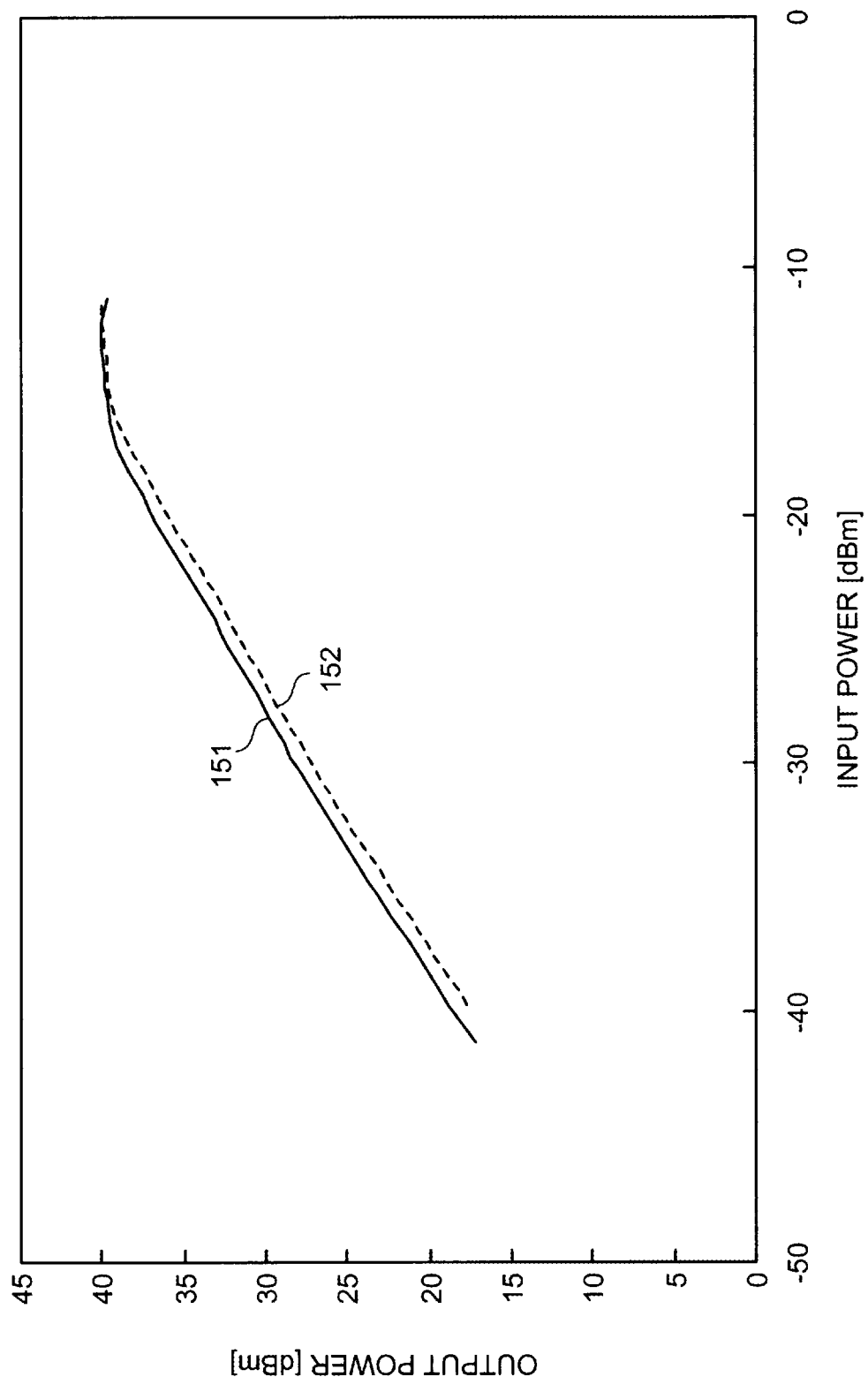

AMPLIFIER

CROSS REFERENCE TO RELATED APPLICATIONS

This application is based upon and claims the benefit of priority of the prior Japanese Patent Application No. 2012-044784, filed on Feb. 29, 2012, the entire contents of which are incorporated herein by reference.

FIELD

The embodiments discussed herein are related to an amplifier.

BACKGROUND

A radio communication device of a mobile communication system, for example, uses an amplifier to amplify a signal of high frequency (see, e.g., Japanese Laid-Open Patent Publication No. 2010-268248, International Publication No. 2009/131138, Published Japanese-Translation of PCT Application, Publication No. 2002-510927, and Japanese Laid-Open Patent Publication No. 2009-213090). In the amplifier, for example, an impedance matching circuit is disposed on the input side and the output side of an amplifying element.

The impedance matching circuit on the input side of the amplifier, for example, converts the characteristic impedance (e.g., 50[Ω]) of an input terminal of the amplifier to a complex conjugation of the input impedance of the amplifying element. The impedance matching circuit on the output side of the amplifier, for example, converts the characteristic impedance (e.g., 50[Ω]) of an output terminal of the amplifier to the complex conjugation of the output impedance of the amplifying element.

To design an electronic amplifier of high efficiency, the impedance matching circuit on the output side is designed so that, for example, the impedance of the output terminal as seen from the amplifying element will be converted to the point of load of the highest efficiency. To design an electronic amplifier of high gain, the impedance matching circuit on the input side is designed so that, for example, the impedance of the input terminal as seen from the amplifying element will be converted to the point of load of the highest gain.

In the conventional technologies described above, however, since the impedance matching circuit has impedance frequency characteristic, when a wideband signal is input, the impedance within the band of the signal can become uneven.

SUMMARY

According to an aspect of an embodiment, an amplifier includes an amplifying element that amplifies an input signal; an output terminal that outputs the signal amplified by the amplifying element; a matching circuit disposed in series between the amplifying element and the output terminal, and performing impedance matching; an impedance converter disposed in series between the amplifying element and the matching circuit or between the matching circuit and the output terminal; and a first resonator and a second resonator connected at the ends of the impedance converter.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 9 depicts a variation example of the amplifier according to the first embodiment;

FIG. 13 depicts one example of a configuration of the amplifier according to a second embodiment;

FIG. 15A depicts one example of a characteristic of output power relative to input power of the amplifier on an assumption that the compensating circuit is not provided;

DESCRIPTION OF EMBODIMENTS

Preferred embodiments of the present invention will be explained with reference to the accompanying drawings.

Figure 1:
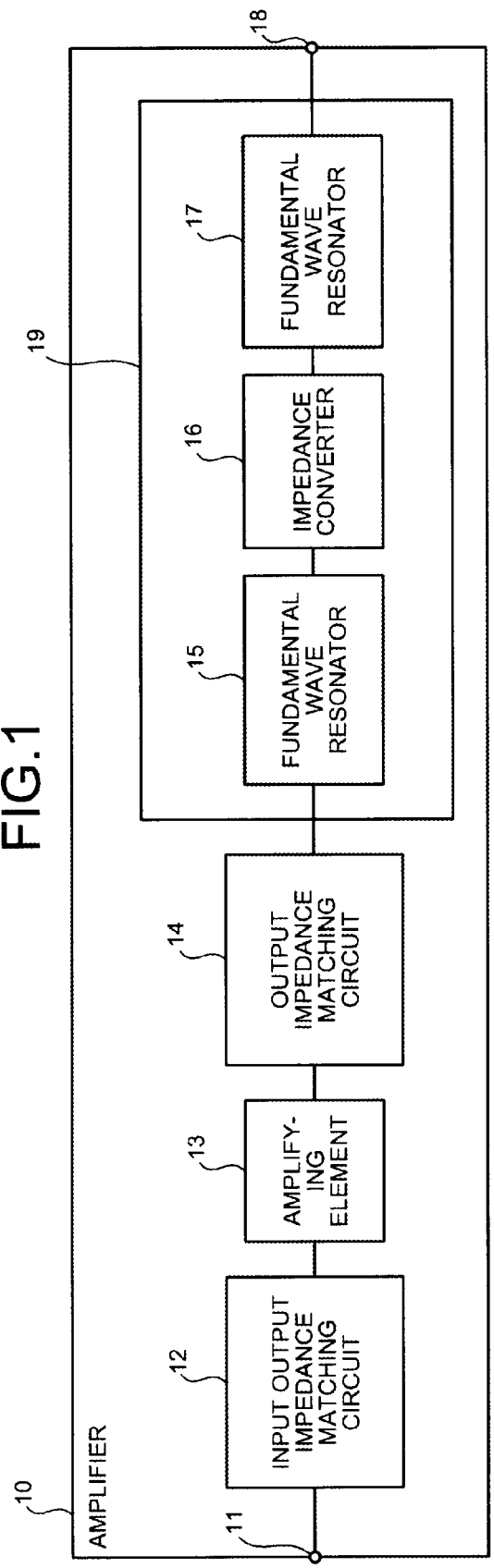
FIG. 1 depicts one example of a configuration of an amplifier according to a first embodiment.

FIG. 1 depicts one example of a configuration of an amplifier according to a first embodiment. As depicted in FIG. 1, an amplifier 10 according to the first embodiment has an input terminal 11, an input impedance matching circuit 12, an amplifying element 13, an output impedance matching circuit 14, a compensating circuit 19, and an output terminal 18. The amplifier 10 is, for example, an amplifier to amplify a signal of high frequency. A signal (electrical signal) to be amplified by the amplifier 10 is input to the input terminal 11. The signal input to the input terminal 11 is output to the input impedance matching circuit 12.

The input impedance matching circuit 12 outputs to the amplifying element 13, the signal output from the input terminal 11 and performs impedance matching of the input terminal 11 and the amplifying element 13. For example, the input impedance matching circuit 12 converts the characteristic impedance of the input terminal 11 to the complex conjugation of the input impedance of the amplifying element 13.

The amplifying element 13 amplifies the signal output from the input impedance matching circuit 12. The amplifying element 13 outputs the amplified signal to the output impedance matching circuit 14.

The output impedance matching circuit 14 outputs to the compensating circuit 19, the signal output from the amplifying element 13 and performs impedance matching of the amplifying element 13 and the compensating circuit 19. For example, it is assumed that the characteristic impedance of the output terminal 18 is 50[Ω] and that an impedance converter 16 of the compensating circuit 19 converts the impedance from 25[Ω] to 50[Ω]. In this case, the output impedance matching circuit 14 performs the impedance matching by converting to 25[Ω]. the impedance from the output impedance of the amplifying element 13.

The compensating circuit 19 outputs to the output terminal 18, the signal output from the output impedance matching circuit 14 and compensates for the impedance frequency characteristic in the output impedance matching circuit 14. For example, the compensating circuit 19 has a fundamental wave resonator 15, the impedance converter 16, and a fundamental wave resonator 17.

The fundamental wave resonator 15 is a resonance circuit connected upstream from the impedance converter 16. The fundamental wave resonator 15 outputs to the impedance converter 16, the signal output from the output impedance matching circuit 14. The impedance converter 16 outputs to the fundamental wave resonator 17, the signal output from the fundamental wave resonator 15 and converts impedance. The fundamental wave resonator 17 is a resonance circuit connected at the subsequent step of the impedance converter 16. The fundamental wave resonator 17 outputs to the output terminal 18, the signal output from the impedance converter 16.

The resonance frequency of one of the fundamental wave resonators 15 and 17 is set lower than the center frequency of the signal to be amplified. The resonance frequency of the other of the fundamental wave resonators 15 and 17 is set higher than the center frequency of the signal to be amplified, thereby making it possible to achieve equalization of the impedance relative to the frequency in the vicinity of the center frequency of the band of the signal to be amplified.

Figure 3:
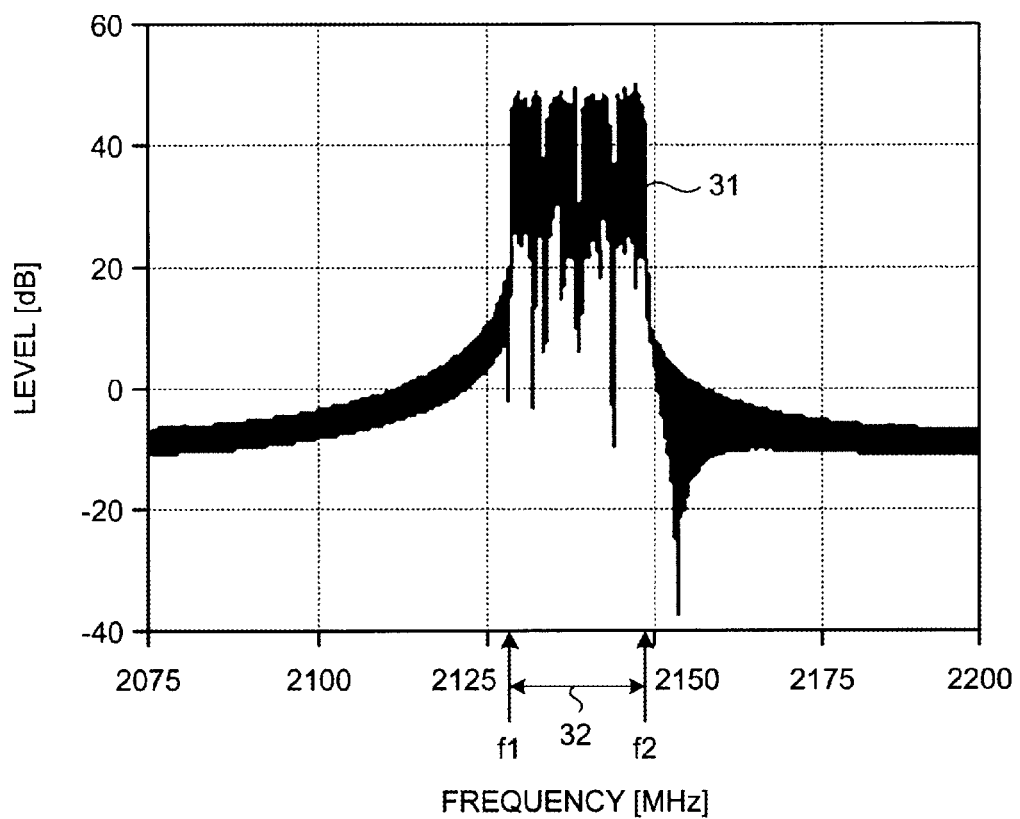
FIG. 3 depicts one example of a relationship of signal band and resonance frequency.

For example, the resonance frequency of one of the fundamental wave resonators 15 and 17 is set at the frequency in the vicinity of the lower edge of the band of the signal to be amplified (see, e.g., FIG. 3). The resonance frequency of the other of the fundamental wave resonators 15 and 17 is set at the frequency in the vicinity of the upper edge of the band of the signal to be amplified (see, e.g., FIG. 3), thereby making it possible to achieve equalization of the impedance relative to the frequency over almost the entire band of the signal to be amplified. For example, it is assumed that the resonance frequency of the fundamental wave resonators 15 and 17 is a frequency lower than twice (harmonic component) the center frequency of the signal to be amplified and higher than a half of the center frequency of the signal to be amplified.

The output terminal 18 outputs the signal output from the compensating circuit 19. Thus, the compensating circuit 19 including the impedance converter 16 and the fundamental wave resonators 15 and 17 connected to the end of the impedance converter 16 is connected to the output of the amplifier 10, thereby making it possible to compensate for the impedance frequency characteristic in the output impedance matching circuit 14 and achieve equalization of the impedance relative to the frequency.

Consequently, the amplification efficiency can be equalized in the band to be amplified, thereby enabling, for example, a design that uniformly raises the amplification efficiency over the entire band to be amplified. The amplification efficiency is, for example, the rate at which dc energy given to the amplifying element 13 is converted to high-frequency energy to be output from the output terminal 18.

For example, if the output impedance matching circuit 14 is designed so that the amplification efficiency will become high at the center frequency of the band to be amplified, the amplification efficiency can be made high even at the edge of the band to be amplified, thereby enabling, for example, enhancement of the efficiency in the case of amplifying a wideband signal.

Figure 2:
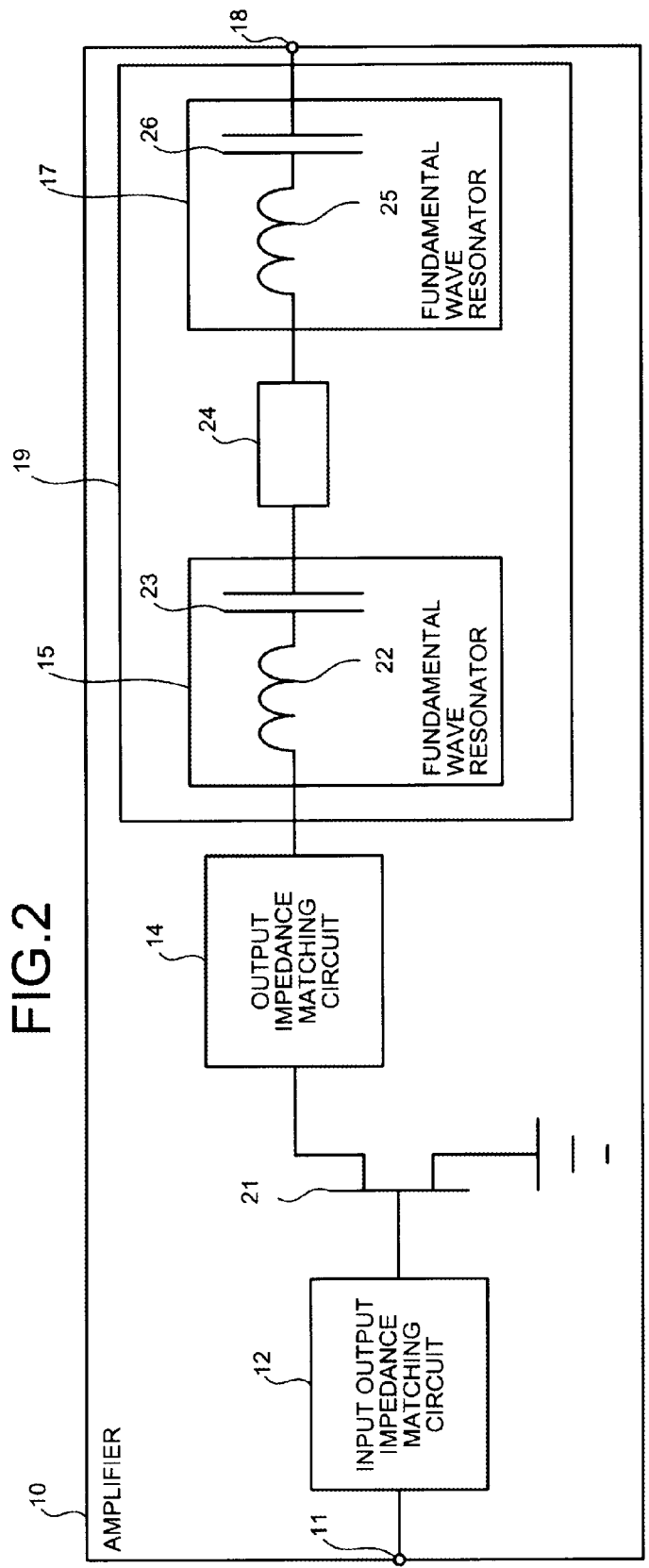
FIG. 2 depicts one example of a configuration of the amplifier.

FIG. 2 depicts one example of a configuration of the amplifier. In FIG. 2, parts identical to those depicted in FIG. 1 are given the same reference numerals used in FIG. 1 and description thereof is omitted. As depicted in FIG. 2, the amplifying element 13 depicted in FIG. 1 can be implemented, for example, by a semiconductor amplifying element 21 such as a field effect transistor (FET) and a bipolar junction transistor (BJT).

The fundamental wave resonator 15 depicted in FIG. 1 can be implemented, for example, by an inductor 22 and a capacitor 23 connected in series. The impedance converter 16 can be implemented, for example, by a quarter-wavelength impedance converter 24. The quarter-wavelength impedance converter 24 is, for example, a transmission line of a length equal to a quarter of the center wavelength of the signal to be amplified. The fundamental wave resonator 17 depicted in FIG. 1 can be implemented, for example, by an inductor 25 and a capacitor 26 connected in series.

FIG. 3 depicts one example of a relationship of a signal band and the resonance frequency. The horizontal axis of FIG. 3 represents the frequency [MHz]. The vertical axis of FIG. 3 represents the level [dB] of signal components. A spectrum 31 indicates one example of a spectrum of the signal to be amplified by the amplifier 10. A spectrum band 32 indicates the band of the spectrum 31.

For example, as depicted in FIG. 3, the resonance frequency of the fundamental wave resonator 15 is set at the lower-edge frequency f1 of the spectrum band 32. The resonance frequency of the fundamental wave resonator 17 is set at the upper-edge frequency f2 of the spectrum band 32, thereby making it possible to achieve equalization of the impedance relative to the frequency over almost the entire spectrum band 32 of the signal to be amplified.

The resonance frequency of the fundamental wave resonator 15 may be set at frequency f2 and the resonance frequency of the fundamental wave resonator 17 may be set at frequency f1. Thus, the resonance frequency of one of the fundamental wave resonators 15 and 17 is set at the lower-edge frequency f1 of the band of the signal to be amplified. The resonance frequency of the other of the fundamental wave resonators 15 and 17 is set at the upper-edge frequency f2 of the band of the signal to be amplified, thereby making it possible to achieve equalization of the impedance relative to the frequency in the band to be amplified (frequency f1 to frequency f2).

Figure 4A:
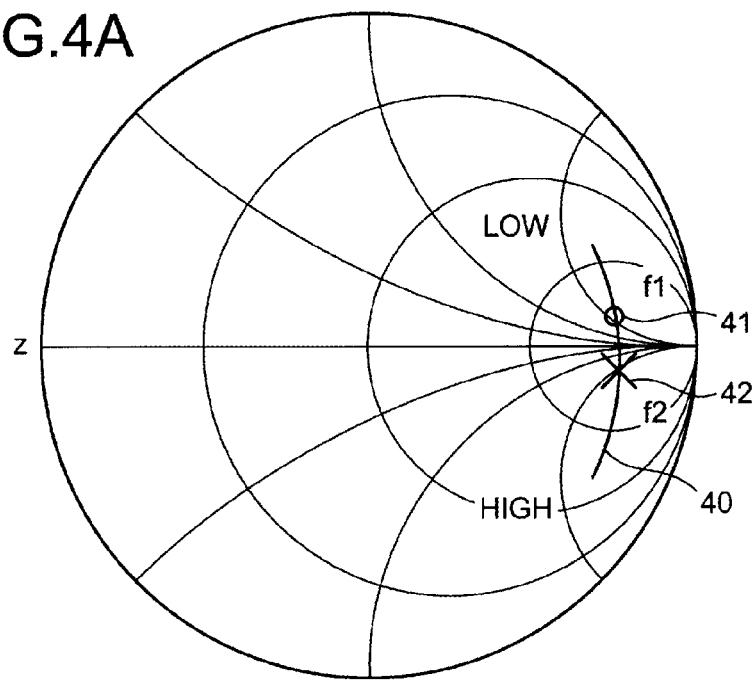
FIG. 4A depicts one example of a frequency characteristic of a load in the amplifier on an assumption that a compensating circuit is not provided.
Figure 4B:
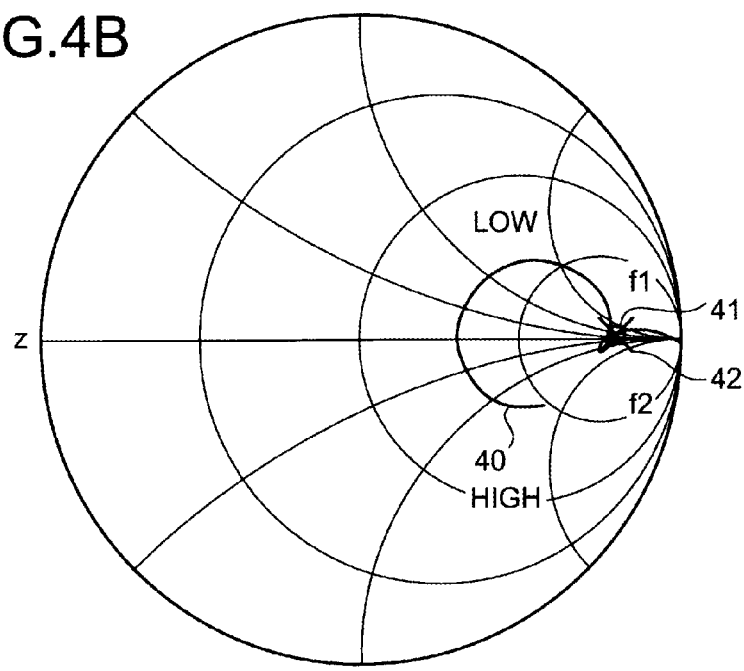
FIG. 4B depicts one example of the frequency characteristic of the load in the amplifier according to the first embodiment.

FIG. 4A depicts one example of the frequency characteristic of the load in the amplifier on the assumption that the compensating circuit is not provided. FIG. 4B depicts one example of the frequency characteristic of the load in the amplifier according to the first embodiment. FIGS. 4A and 4B depict the point of load in the amplifier 10 by the Smith chart.

In FIGS. 4A and 4B, load characteristic 40 indicates the characteristic of the load, as seen from amplifying element 13 toward the output side, relative to the frequency. A point of load 41 (o-mark) indicates the point of load indicative of the load as seen from the amplifying element 13 toward the output side, at the lower-edge frequency f1 (see FIG. 3) of the band. A point of load 42 (x-mark) indicates the point of load indicative of the load as seen from the amplifying element 13 toward the output side, at the upper-edge frequency f2 (see FIG. 3) of the band.

In the amplifier 10 on the assumption that the compensating circuit 19 is not provided, the point of load 41 at frequency f1 and the point of load 42 at frequency f2 are different points of load as depicted in FIG. 4A. In contrast, the amplifier 10 having the compensating circuit 19 can cause the point of load 41 at frequency f1 and the point of load 42 at frequency f2 to almost match as depicted in FIG. 4B.

Figure 5A:
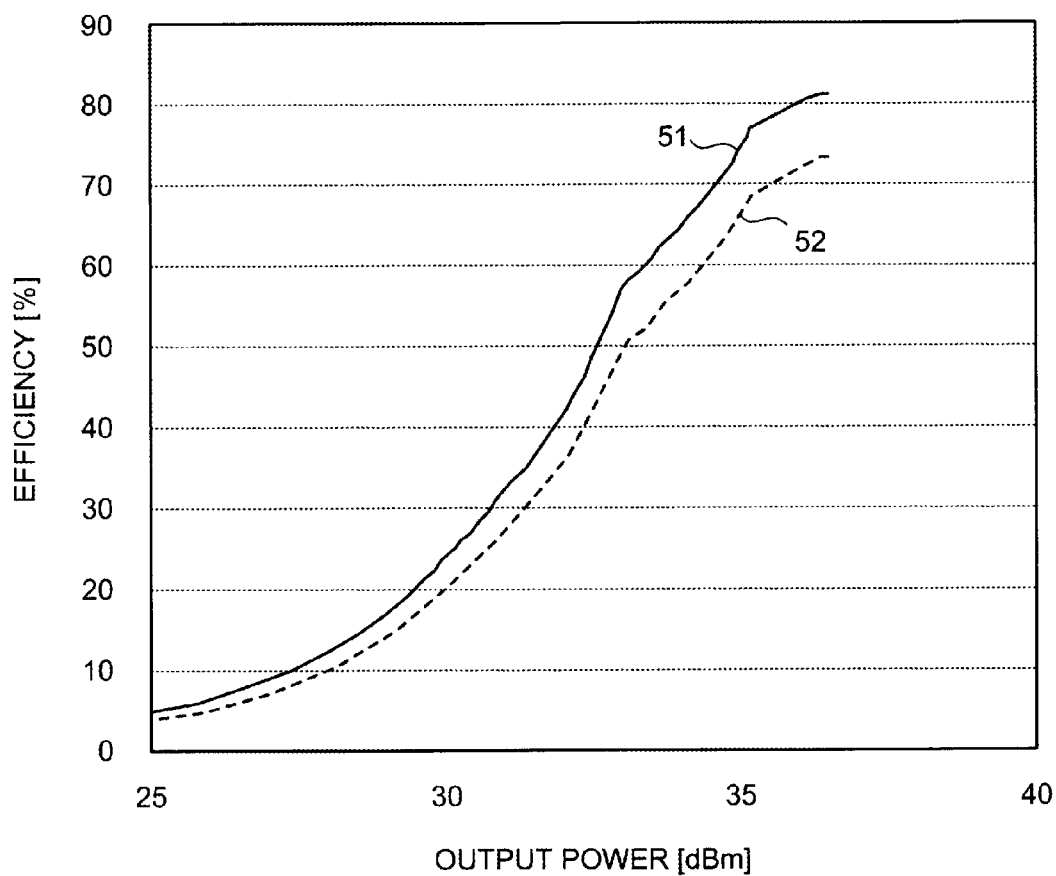
FIG. 5A depicts one example of a characteristic of efficiency relative to output power of the amplifier on an assumption that the compensating circuit is not provided.
Figure 5B:
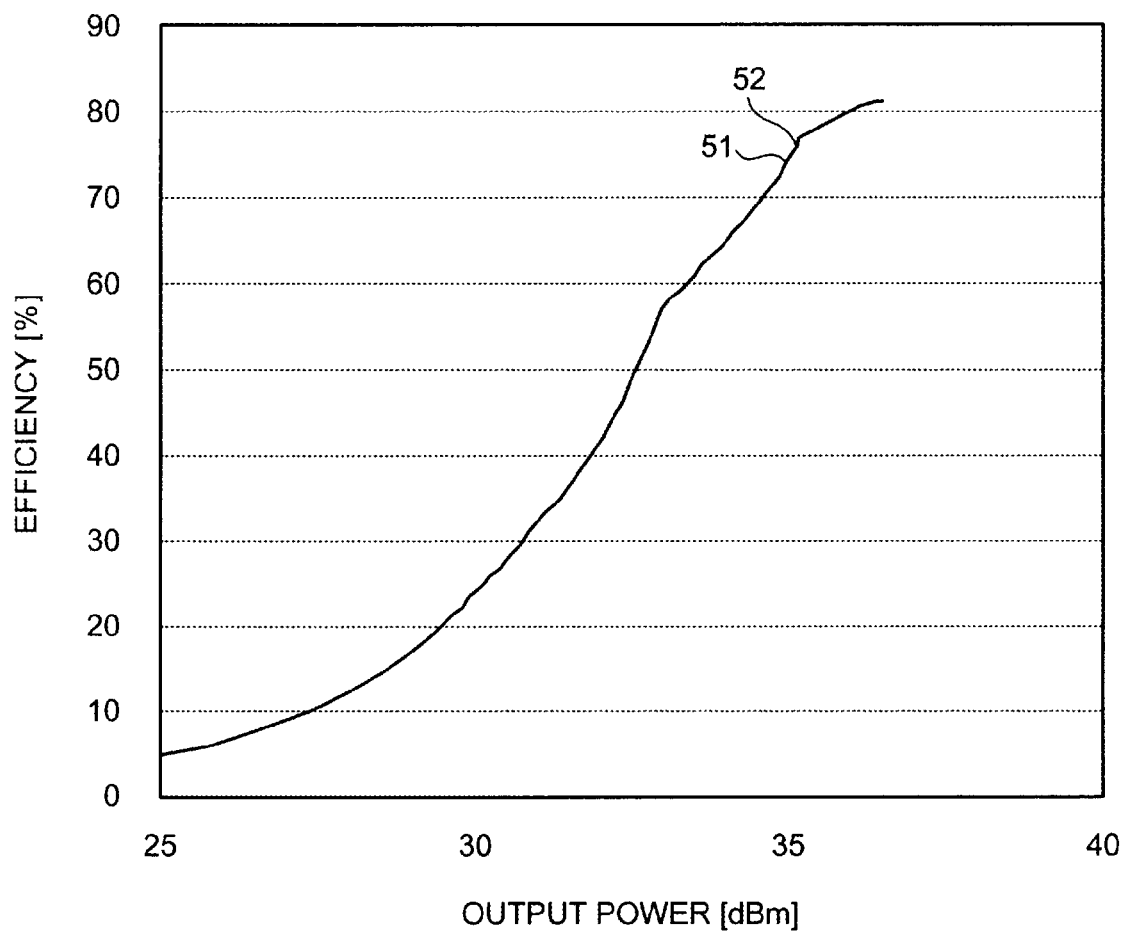
FIG. 5B depicts one example of the characteristic of the efficiency relative to the output power of the amplifier according to the first embodiment.

FIG. 5A depicts one example of the characteristic of the efficiency relative to an output power of the amplifier on the assumption that the compensating circuit is not provided. FIG. 5B depicts one example of the characteristic of the efficiency relative to the output power of the amplifier according to the first embodiment. The horizontal axis of FIGS. 5A and 5B represents the output power [dBm] from the amplifier 10. The vertical axis of FIGS. 5A and 5B represents the amplification efficiency [%] in the amplifier 10.

In FIGS. 5A and 5B, the efficiency characteristic 51 indicates the characteristic of the efficiency relative to the output power of the amplifier 10 at the center frequency of the signal to be amplified. The efficiency characteristic 52 indicates the characteristic of the efficiency relative to the output power of the amplifier 10 at the edge (e.g., frequency f1 or frequency f2) of the band of the signal to be amplified.

In the amplifier 10 on the assumption that the compensating circuit 19 is not provided, a gap is caused between the efficiency characteristic 51 at the center frequency and the efficiency characteristic 52 at the edge of the band as depicted in FIG. 5A. In contrast, the amplifier 10 having the compensating circuit 19 can cause the efficiency characteristic 51 at the center frequency and the efficiency characteristic 52 at the edge of the band to almost match as depicted in FIG. 5B.

Figure 6:
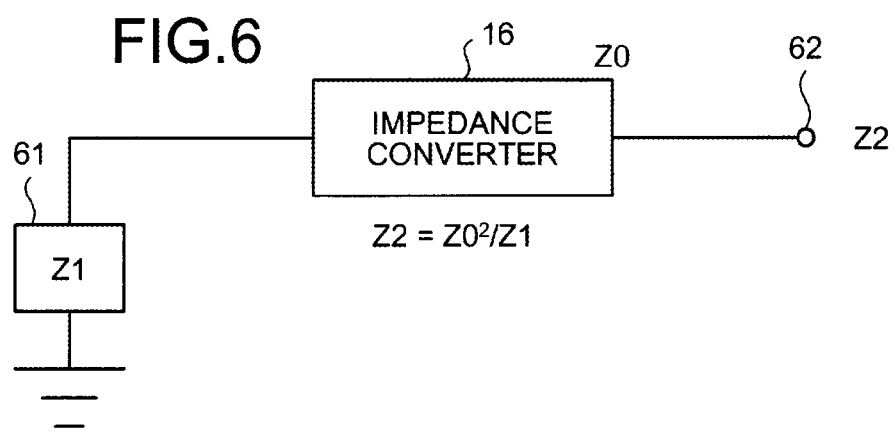
FIG. 6 depicts one example of a characteristic of an impedance converter.

FIG. 6 depicts one example of the characteristic of the impedance converter. For example, as depicted in FIG. 6, the load connected to one end of the impedance converter 16 is given as a load 61 and the terminal connected to the other end of the impedance converter 16 is given as a terminal 62.

The load 61 is given as $Z1$. The characteristic impedance of the impedance converter 16 is given as $Z0$. The impedance of the impedance converter 16 as seen from the terminal 62 is given as $Z2$. In this condition, the impedance converter 16 is designed (e.g., quarter-wavelength impedance converter 24) so that $Z2=Z0^2/Z1$ will apply. For example, the impedance converter 16 is designed so that when $Z1=50[\Omega]$ and $Z2=25[\Omega]$, $Z0$ will become: $Z0=35.36[\Omega]$.

Figure 7A:
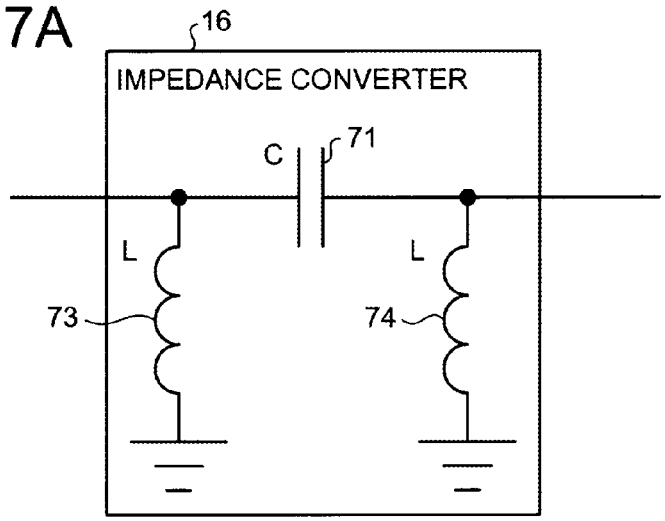
FIG. 7A depicts a configuration example 1 of the impedance converter.

FIG. 7A depicts a configuration example 1 of the impedance converter. The impedance converter 16 may be implemented by a series-connected capacitor 71 and parallel-connected inductors 73 and 74 as depicted in FIG. 7A. The capacitor 71 is connected in series between an input port and an output port of the impedance converter 16.

The inductor 73 has one end thereof connected between the input port of the impedance converter 16 and the capacitor 71, and has the other end thereof grounded. The inductor 74 has one end thereof connected between the output port of the impedance converter 16 and the capacitor 71, and has the other end thereof grounded. The capacitance C of the capacitor 71 and the inductance L of the inductors 73 and 74 are set so that impedance $Z2$ as seen from one end will become $Z1$ as seen from the other end.

Figure 7B:
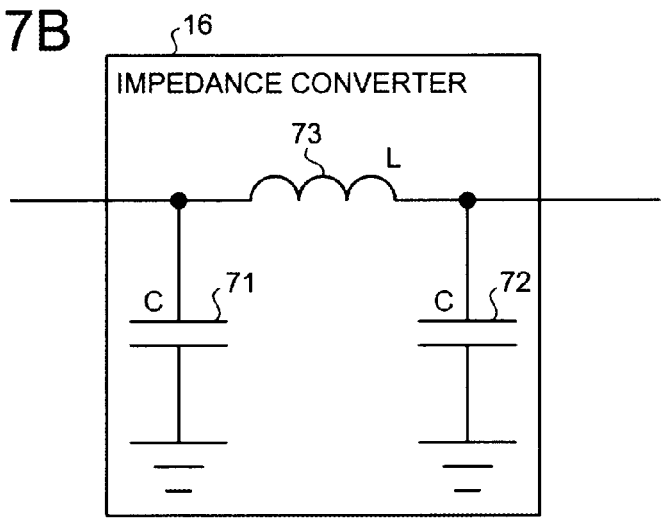
FIG. 7B depicts a configuration example 2 of the impedance converter.

FIG. 7B depicts a configuration example 2 of the impedance converter. The impedance converter 16 may be implemented by parallel-connected capacitors 71 and 72 and the series-connected inductor 73 as depicted in FIG. 7B. The inductor 73 is connected in series between the input port and the output port of the impedance converter 16.

The capacitor 71 has one end thereof connected between the input port of the impedance converter 16 and the inductor 73 and has the other end thereof grounded. The capacitor 72 has one end thereof connected between the output port of the impedance converter 16 and the inductor 73 and has the other end thereof grounded. The capacitance C of the capacitors 71 and 72 and the inductance L of the inductor 73 are set so that impedance $Z2$ as seen from one end will become $Z1$ as seen from the other end.

Figure 7C:
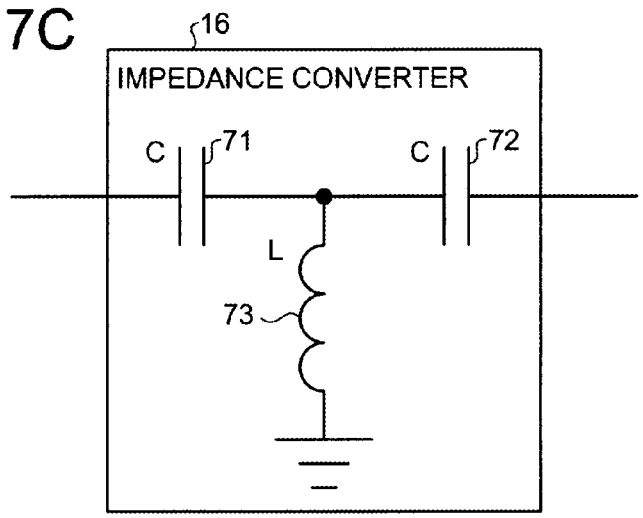
FIG. 7C depicts a configuration example 3 of the impedance converter.

FIG. 7C depicts a configuration example 3 of the impedance converter. The impedance converter 16 may be implemented by the series-connected capacitors 71 and 72 and the parallel-connected inductor 73 as depicted in FIG. 7C. The capacitors 71 and 72 are connected in series between the input port and the output port of the impedance converter 16.

The inductor 73 has one end thereof connected between the capacitor 71 and the capacitor 72 and has the other end thereof grounded. The capacitance C of the capacitors 71 and 72 and the inductance L of the inductor 73 are set so that impedance $Z2$ as seen from one end will become $Z1$ as seen from the other end.

Figure 7D:
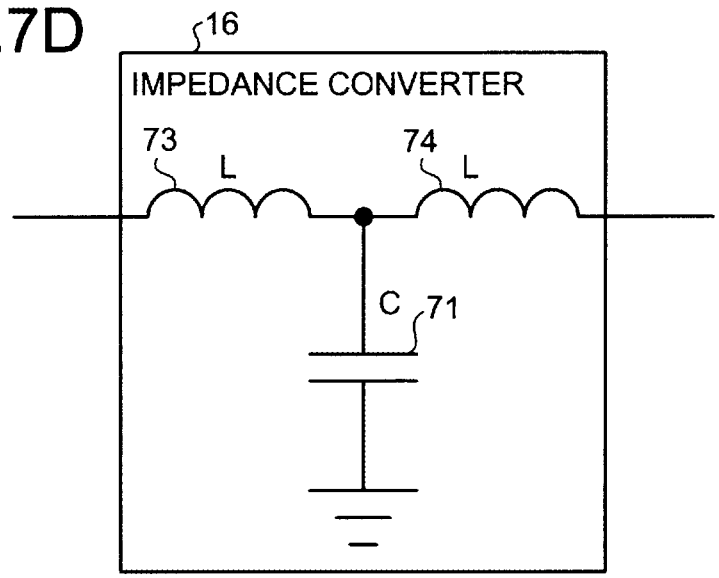
FIG. 7D depicts a configuration example 4 of the impedance converter.

FIG. 7D depicts a configuration example 4 of the impedance converter. The impedance converter 16 may be implemented by the parallel-connected capacitor 71 and the series-connected inductors 73 and 74 as depicted in FIG. 7D. The inductors 73 and 74 are connected in series between the input port and the output port of the impedance converter 16.

The capacitor 71 has one end thereof connected between the inductor 73 and the inductor 74 and has the other end thereof grounded. The capacitance C of the capacitor 71 and the inductance L of the inductors 73 and 74 are set so that impedance $Z2$ as seen from one end will become $Z1$ as seen from the other end.

Figure 8A:
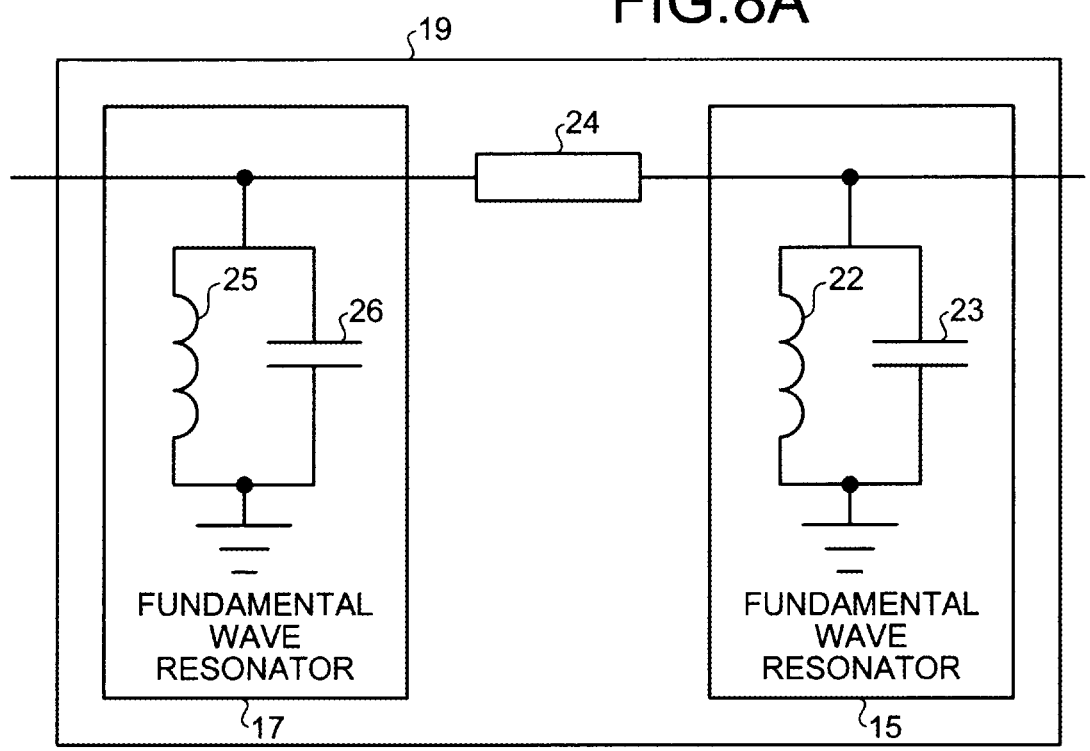
FIG. 8A depicts a configuration example 1 of the compensating circuit.

FIG. 8A depicts a configuration example 1 of the compensating circuit. In FIG. 8A, parts identical to those depicted in FIG. 2 are given the same reference numerals used in FIG. 2 and description thereof is omitted. Each of the fundamental wave resonator 15 and the fundamental wave resonator 17 may be a parallel resonance circuit as depicted in FIG. 8A. In this case, the fundamental wave resonator 15 is disposed at the subsequent step of the quarter-wavelength impedance converter 24 and the fundamental wave resonator 17 is disposed at the previous step of the quarter-wavelength impedance converter 24.

The inductor 22 and the capacitor 23 of the fundamental wave resonator 15 have one end thereof connected in parallel between the input port and the output port of the fundamental wave resonator 15 and have the other end thereof grounded. The inductor 25 and the capacitor 26 of the fundamental wave resonator 17 have one end thereof connected in parallel between the input port and the output port of the fundamental wave resonator 17 and have the other end thereof grounded. The compensating circuit 19 depicted in FIG. 8A is an equivalent circuit of the compensating circuit 19 depicted in FIG. 2.

Figure 8B:
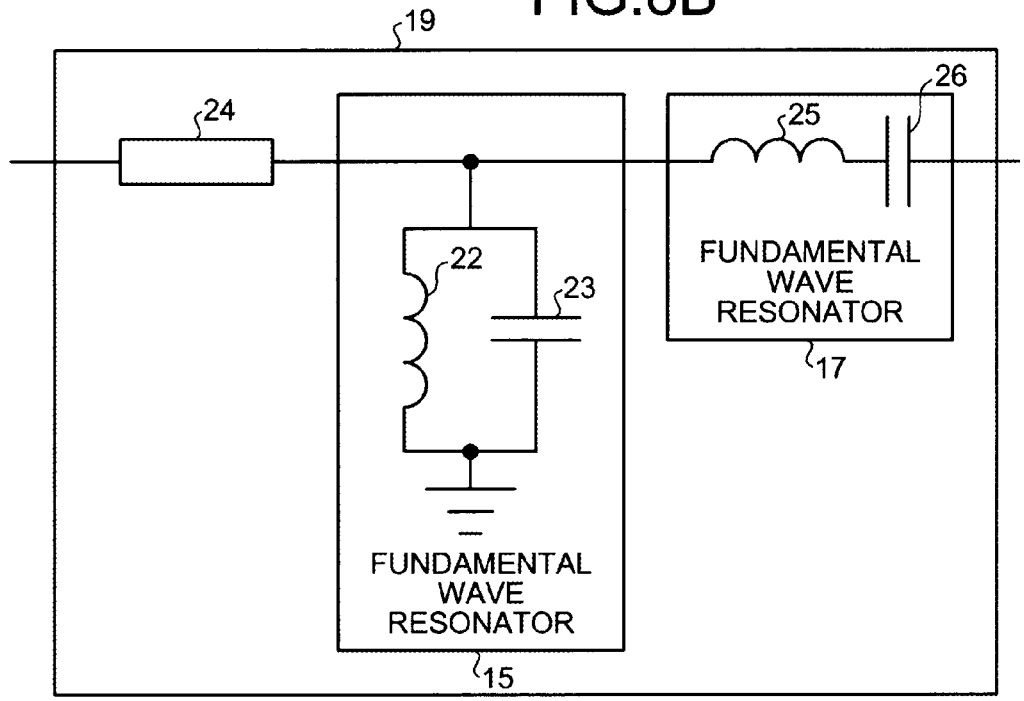
FIG. 8B depicts a configuration example 2 of the compensating circuit.

FIG. 8B depicts a configuration example 2 of the compensating circuit. In FIG. 8B, parts identical to those depicted in FIG. 2 are given the same reference numerals used in FIG. 2 and description thereof is omitted. The fundamental wave resonator 15 may be the parallel resonance circuit and the fundamental wave resonator 17 may be a series resonance circuit as depicted in FIG. 8B. In this case, the fundamental wave resonator 15 and the fundamental wave resonator 17 are disposed downstream from the quarter-wavelength impedance converter 24.

In the configuration example depicted in FIG. 8B, the fundamental wave resonator 15 is disposed between the fundamental wave resonator 17 and the quarter-wavelength impedance converter 24. The inductor 22 and the capacitor 23 of the fundamental wave resonator 15 have one end thereof connected in parallel between the input port and the output port of the fundamental wave resonator 15 and have the other end thereof grounded. The compensating circuit 19 depicted in FIG. 8B is an equivalent circuit of the compensating circuit 19 depicted in FIGS. 2 and 8A.

Figure 8C:
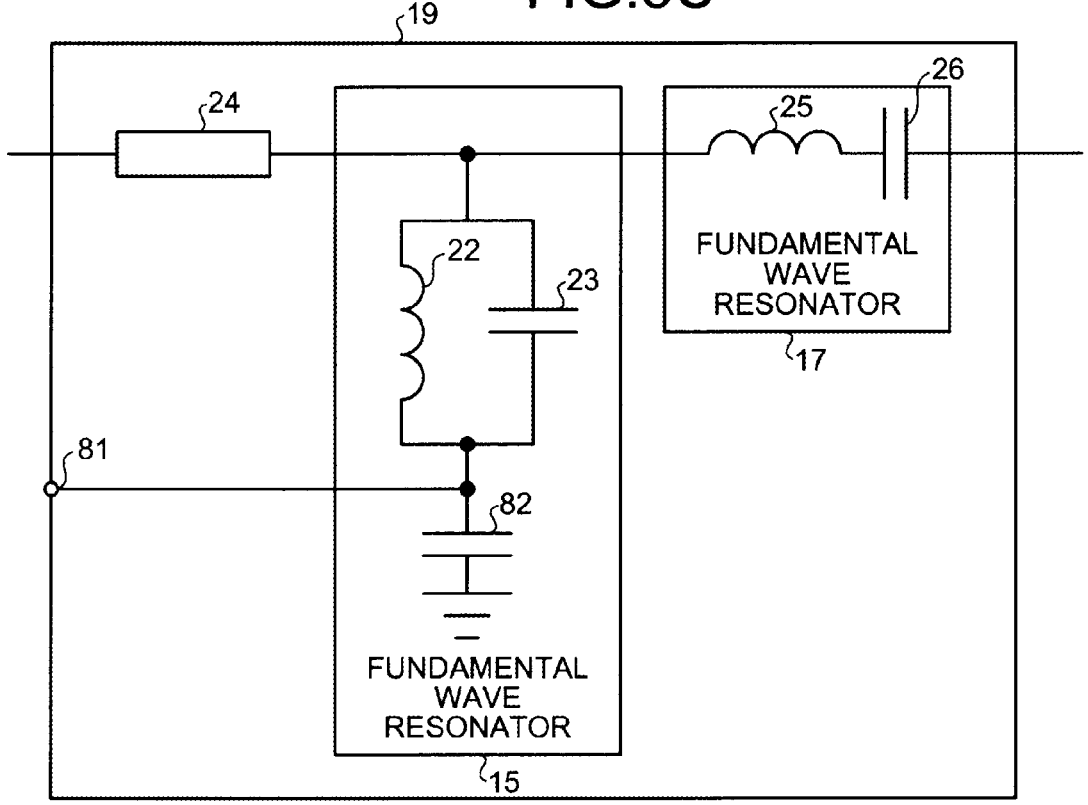
FIG. 8C depicts a configuration example 3 of the compensating circuit.

FIG. 8C depicts a configuration example 3 of the compensating circuit. In FIG. 8C, parts identical to those depicted in FIG. 8B are given the same reference numerals used in FIG. 8B and description thereof is omitted. The fundamental wave resonator 15 may further have a bias terminal 81 and a capacitor 82 as depicted in FIG. 8C. A power source is supplied to the bias terminal 81.

The bias terminal 81 is connected to the inductor 22, the capacitor 23, and the capacitor 82. The capacitor 82 has one end thereof connected to the inductor 22, the capacitor 23, and the bias terminal 81 and has the other end thereof grounded.

The fundamental wave resonator 15 as the parallel resonance circuit does not pass the fundamental wave and does not pass the high-frequency wave of the frequency higher than that of the fundamental wave since the impedance of the inductor 22 is caused to become large. On the other hand, the fundamental wave resonator 15 as the parallel resonance circuit passes a direct current component. For this reason, with the bias terminal 81 connected, the fundamental wave resonator 15 can have a function of a power supply circuit.

In the configuration example depicted in FIG. 8C, since the capacitor 26 is connected in series with the output port of the compensating circuit 19, the capacitor 26 can have a function of removing the direct current component.

Figure 8D:
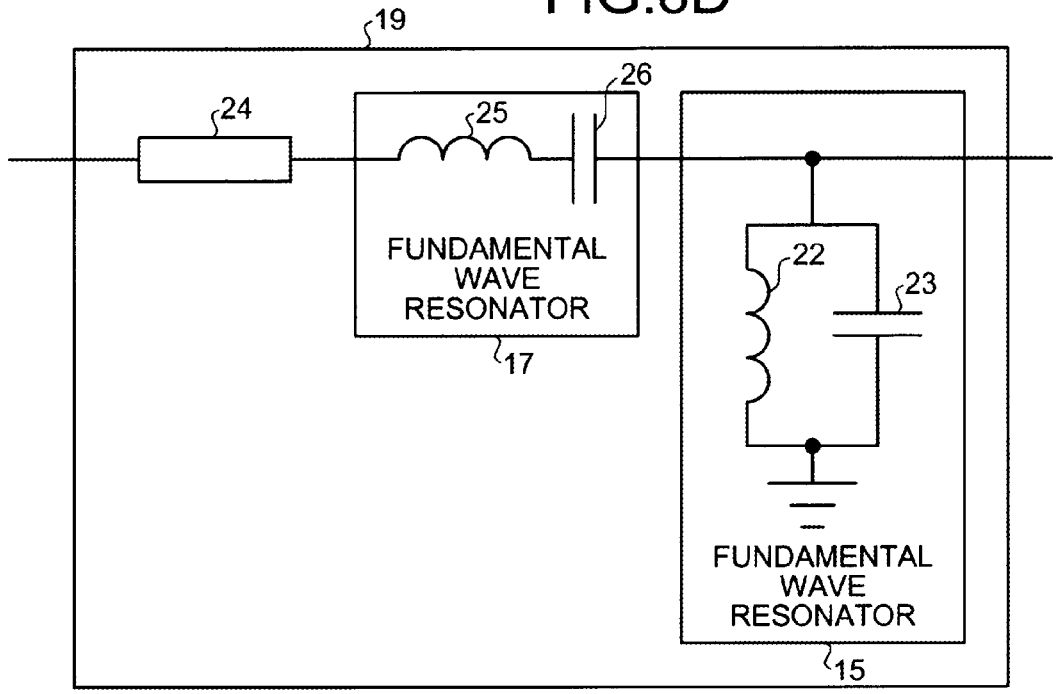
FIG. 8D depicts a configuration example 4 of the compensating circuit.

FIG. 8D depicts a configuration example 4 of the compensating circuit. In FIG. 8D, parts identical to those depicted in FIG. 8B are given the same reference numerals used in FIG. 8B and description thereof is omitted. The fundamental wave resonator 17 may be disposed between the quarter-wavelength impedance converter 24 and the fundamental wave resonator 15 as depicted in FIG. 8D. In this case, the fundamental wave resonator 15 may further have the bias terminal 81 and the capacitor 82 as depicted in, for example, FIG. 8C.

Figure 8E:
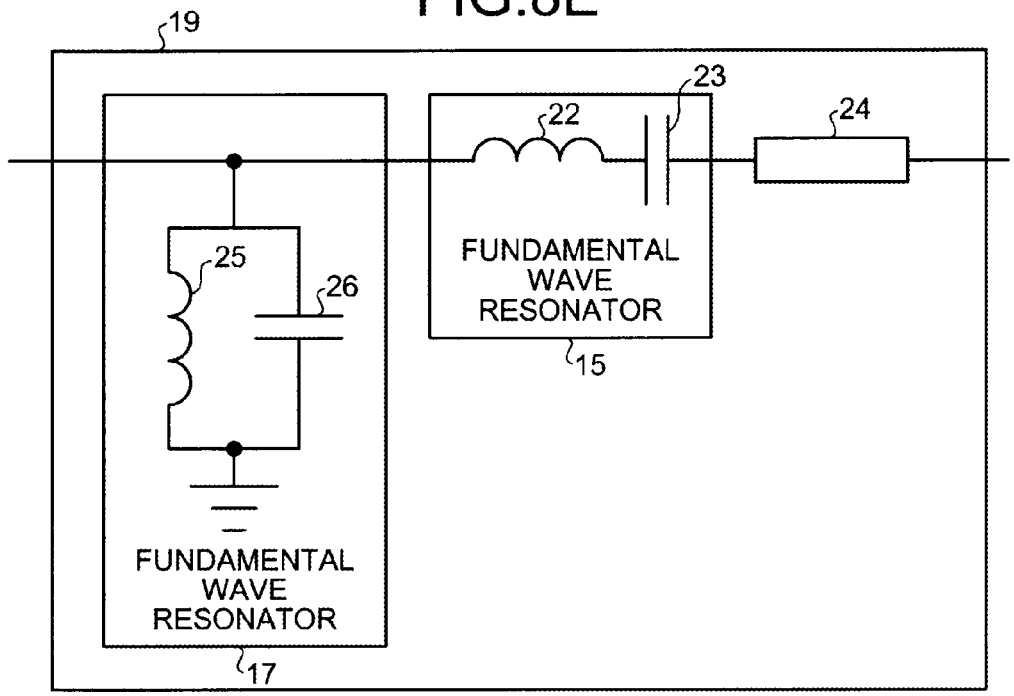
FIG. 8E depicts a configuration example 5 of the compensating circuit.

FIG. 8E depicts a configuration example 5 of the compensating circuit. In FIG. 8E, parts identical to those depicted in FIG. 2 are given the same reference numerals used in FIG. 2 and description thereof is omitted. The fundamental wave resonator 17 may be the parallel resonance circuit and the fundamental wave resonator 15 may be the series resonance circuit as depicted in FIG. 8E. In this case, the fundamental wave resonator 15 and the fundamental wave resonator 17 are disposed upstream from the quarter-wavelength impedance converter 24.

In the configuration example depicted in FIG. 8E, the fundamental wave resonator 15 is disposed between the fundamental wave resonator 17 and the quarter-wavelength impedance converter 24. The inductor 25 and the capacitor 26 of the fundamental wave resonator 17 have one end thereof connected in parallel between the input port and the output port of the fundamental wave resonator 17 and have the other end thereof grounded. The compensating circuit 19 depicted in FIG. 8E is an equivalent circuit of the compensating circuit 19 depicted in FIGS. 2, 8A, and 8B.

In the compensating circuit 19 depicted in FIG. 8E, the fundamental wave resonator 17 may further have the bias terminal 81 and the capacitor 82 as depicted in, for example, FIG. 8C. In the compensating circuit 19 depicted in FIG. 8E, the fundamental wave resonator 17 may be disposed between the quarter-wavelength impedance converter 24 and the fundamental wave resonator 15.

As depicted in FIG. 2 and FIGS. 8A to 8E, the fundamental wave resonator 15 can be implemented by the series resonance circuit connected in series upstream from the quarter-wavelength impedance converter 24 or the parallel resonance circuit connected in parallel downstream from the quarter-wavelength impedance converter 24. The fundamental wave resonator 17 can be implemented by the series resonance circuit connected in series downstream from the quarter-wavelength impedance converter 24 or the parallel resonance circuit connected in parallel upstream from the quarter-wavelength impedance converter 24.

FIG. 9 depicts a variation example of the amplifier according to the first embodiment. In FIG. 9, parts identical to those depicted in FIG. 1 are given the same reference numerals used in FIG. 1 and description thereof is omitted. The compensating circuit 19 may be disposed between the amplifying element 13 and the output impedance matching circuit 14 as depicted in FIG. 9. Thus, even a configuration in which the positions of the output impedance matching circuit 14 and the compensating circuit 19 are exchanged, like the configuration depicted in FIG. 1, can achieve equalization of the impedance relative to the frequency.

In the configuration depicted in FIG. 9, parameters of the impedance converter 16 and the output impedance matching circuit 14 to perform the impedance matching of the amplifying element 13 and the output terminal 18 can be different from those in the configuration depicted in FIG. 1.

Figure 10:
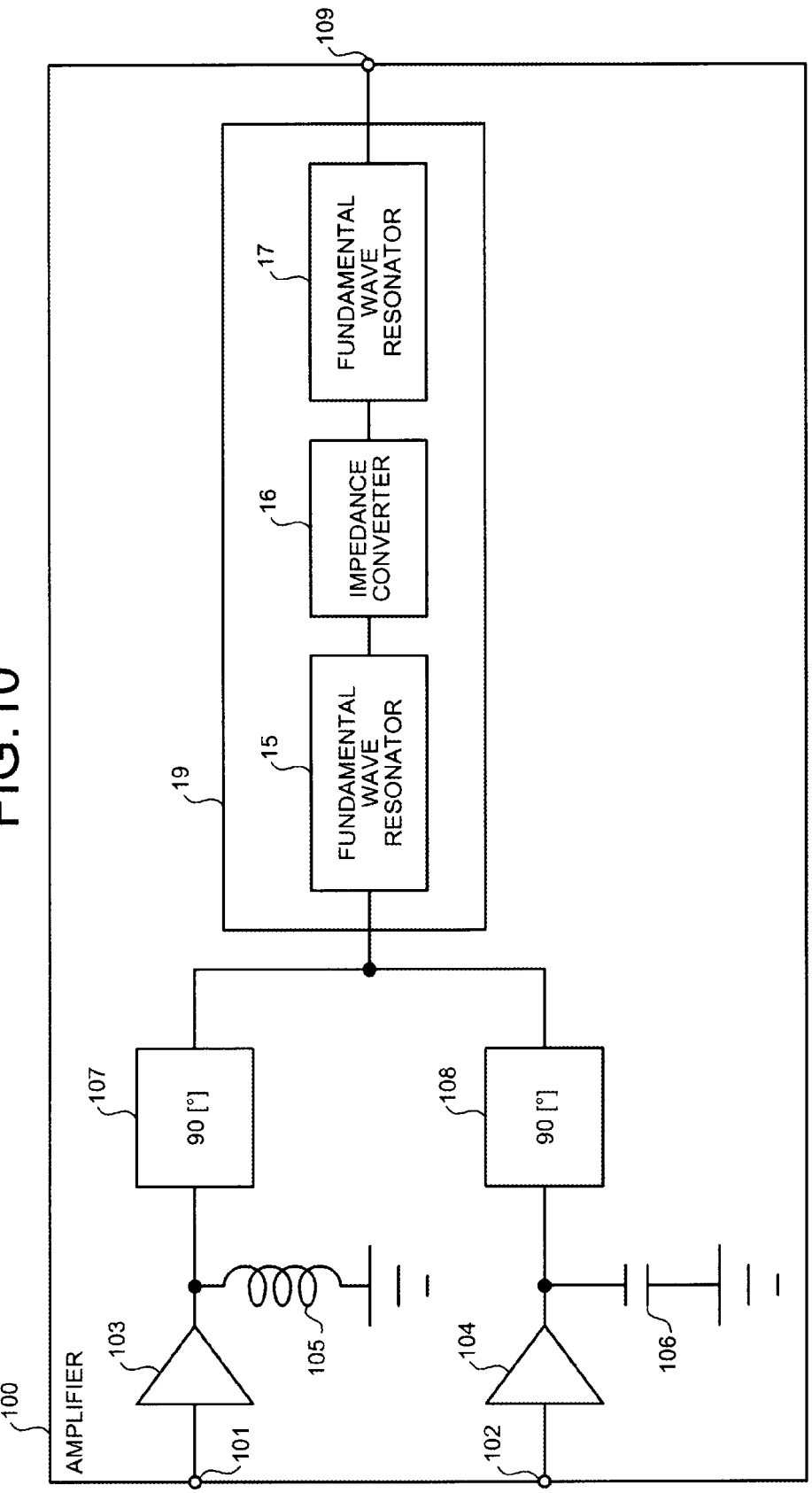
FIG. 10 depicts an application example 1 of the amplifier.

FIG. 10 depicts an application example 1 of the amplifier. In FIG. 10, parts identical to those depicted in FIG. 1 are given the same reference numerals used in FIG. 1 and description thereof is omitted. An amplifier 100 depicted in FIG. 10 is a Chireix-type outphasing amplifier having input terminals 101 and 102, amplifying units 103 and 104, an inductor 105, a capacitor 106, transmission lines 107 and 108, the compensating circuit 19, and an output terminal 109. Two signals having a phase difference depending on the strength of the signal to be amplified are input to the input terminals 101 and 102.

Each of the amplifying units 103 and 104 has the input impedance matching circuit 12, the amplifying element 13, and the output impedance matching circuit 14 depicted in, for example, FIG. 1. The amplifying unit 103 amplifies the signal input from the input terminal 101 and outputs the amplified signal to the transmission line 107. The amplifying unit 104 amplifies the signal input from the input terminal 102 and outputs the amplified signal to the transmission line 108.

The inductor 105 has one end thereof connected between the amplifying unit 103 and the transmission line 107 and has the other end thereof grounded. The capacitor 106 has one end thereof connected between the amplifying unit 104 and the transmission line 108 and has the other end thereof grounded.

Both of the transmission lines 107 and 108 are transmission lines having the delay amount of 90 [degrees]. The transmission line 107 outputs to the compensating circuit 19, the signal output from the amplifying unit 103. The transmission line 108 outputs to the compensating circuit 19, the signal output from the amplifying unit 104. The signals output from the transmission lines 107 and 108 are synthesized and input to the compensating circuit 19.

The quarter-wavelength impedance converter as a constituent element of the Chireix-type outphasing amplifier can be used for the impedance converter 16 of the compensating circuit 19, thereby making it possible to achieve equalization of the impedance relative to the frequency while suppressing an increase of the circuit size, in the Chireix-type outphasing amplifier. The output terminal 109 outputs the signal output from compensating circuit 19.

Figure 11:
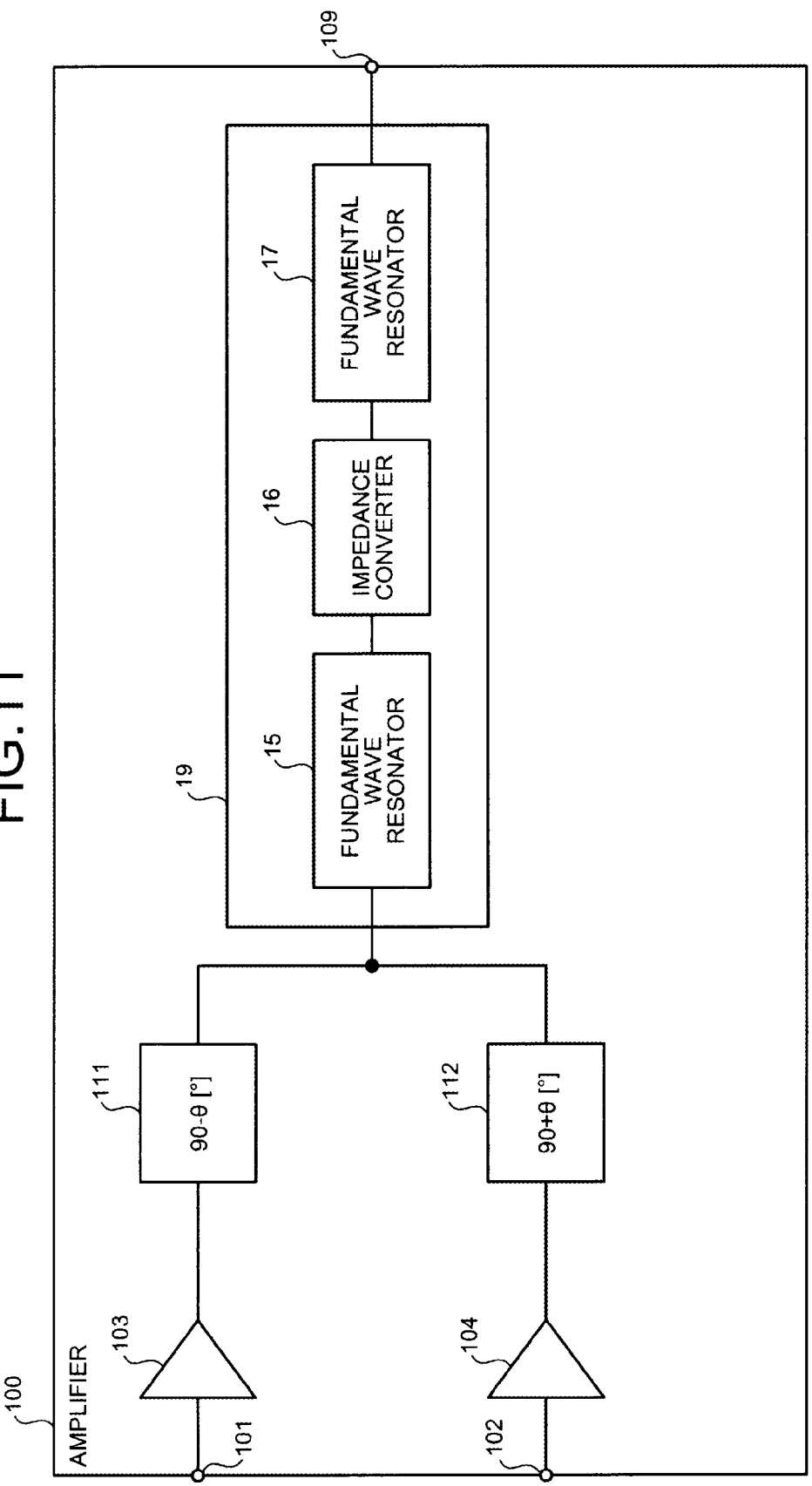
FIG. 11 depicts an application example 2 of the amplifier.

FIG. 11 depicts an application example 2 of the amplifier. In FIG. 11, parts identical to those depicted in FIG. 10 are given the same reference numerals used in FIG. 10 and description thereof is omitted. The amplifier 100 depicted in FIG. 11 is an offset-type outphasing amplifier having the input terminals 101 and 102, the amplifying units 103 and 104, transmission lines 111 and 112, the compensating circuit 19, and the output terminal 109. The amplifying unit 103 outputs the amplified signal to the transmission line 111. The amplifying unit 104 outputs the amplified signal to the transmission line 112.

The transmission line 111 is a transmission line having the delay amount of 90−θ [degrees]. The transmission line 111 outputs to the compensating circuit 19, the signal output from the amplifying unit 103. The transmission line 112 is a transmission line having the delay amount of 90+θ [degrees]. The transmission line 112 outputs to the compensating circuit 19, the signal output from the amplifying unit 104. The signals output from the transmission lines 111 and 112 are synthesized and input to the compensating circuit 19.

The quarter-wavelength impedance converter as a constituent element of the offset-type outphasing amplifier can be used for the impedance converter 16 of the compensating circuit 19, thereby making it possible to achieve equalization of the impedance relative to the frequency while suppressing an increase of the circuit size, in the offset-type outphasing amplifier.

Figure 12:
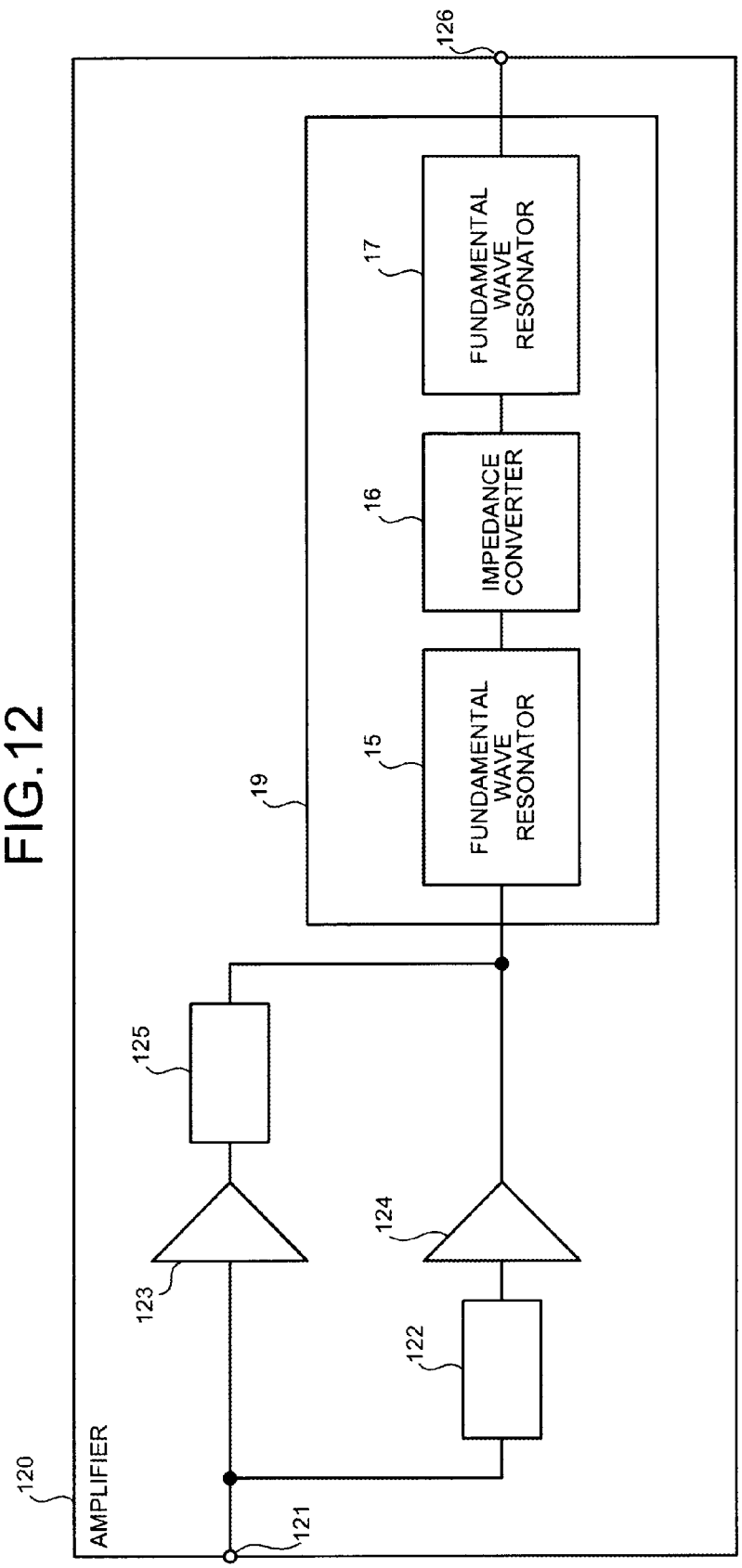
FIG. 12 depicts an application example 3 of the amplifier.

FIG. 12 depicts an application example 3 of the amplifier. In FIG. 12, parts identical to those depicted in FIG. 1 are given the same reference numerals used in FIG. 1 and description thereof is omitted. An amplifier 120 depicted in FIG. 12 is a Doherty-type amplifier having an input terminal 121, quarter-wavelength transmission lines 122 and 125, carrier amplifiers 123 and 124, the compensating circuit 19, and an output terminal 126.

The signal to be amplified is input to the input terminal 121. The signal input from the input terminal 121 is input to the quarter-wavelength transmission line 122 and the carrier amplifier 123. The quarter-wavelength transmission line 122 is a transmission line of a length equal to a quarter of the center wavelength of the signal to be amplified. The quarter-wavelength transmission line 122 outputs the signal input from the input terminal 121 to the carrier amplifier 124.

Each of the carrier amplifiers 123 and 124 has the input impedance matching circuit 12, the amplifying element 13, and the output impedance matching circuit 14 depicted in, for example, FIG. 1. The carrier amplifier 123 amplifies the signal input from the input terminal 121 and outputs the amplified signal to the quarter-wavelength transmission line 125. The carrier amplifier 124 amplifies the signal output from the quarter-wavelength transmission line 122 and outputs the amplified signal to the compensating circuit 19. The quarter-wavelength transmission line 125 is a transmission line of a length equal to a quarter of the center wavelength of the signal to be amplified. The quarter-wavelength transmission line 125 outputs to the compensating circuit 19, the signal output from the carrier amplifier 123.

The quarter-wavelength impedance converter as a constituent element of the Doherty-type amplifier can be used for the impedance converter 16 of the compensating circuit 19, thereby making it possible to achieve equalization of the impedance relative to the frequency while suppressing an increase of the circuit size, in the Doherty-type amplifier. The output terminal 126 outputs the signal output from the compensating circuit 19.

Thus, in the amplifier 10 according to the first embodiment, the compensating circuit 19 having the fundamental wave resonators 15 and 17 disposed at the end of the impedance converter 16 is connected in series with the output impedance matching circuit 14, thereby making it possible to compensate for the frequency characteristic of the output impedance matching circuit 14 and achieve equalization of the impedance relative to the frequency.

Concerning a second embodiment, differences from the first embodiment will be described.

FIG. 13 depicts one example of a configuration of the amplifier according to the second embodiment. In FIG. 13, parts identical to those depicted in FIG. 1 are given the same reference numerals used in FIG. 1 and description thereof is omitted. As depicted in FIG. 13, the amplifier 10 according to the second embodiment has the compensating circuit 19 disposed between the input terminal 11 and the input impedance matching circuit 12. The input impedance matching circuit 12 performs the impedance matching of the compensating circuit 19 and the amplifying element 13.

For example, it is assumed that the characteristic impedance of the input terminal 11 is 50[Ω] and that the impedance converter 16 of the compensating circuit 19 converts the impedance from 50[Ω] to 25[Ω]. In this case, the input impedance matching circuit 12 performs the impedance matching by converting the impedance from 25[Ω] to the input impedance of the amplifying element 13.

Since the input impedance matching circuit 12 has the frequency characteristic, the frequency deviation of the gain occurs. In contrast, the compensating circuit 19 outputs to the input impedance matching circuit 12, the signal input from the input terminal 11 and compensates for the impedance frequency characteristic in the input impedance matching circuit 12.

Thus, the compensating circuit 19 including the impedance converter 16 and the fundamental wave resonators 15 and 17 connected to the end of the impedance converter 16 is connected to the input of the amplifier 10, thereby making it possible to compensate for the impedance frequency characteristic in the input impedance matching circuit 12 and achieve equalization of the impedance relative to the frequency.

For this reason, the gain in the band to be amplified can be equalized, thereby enabling, for example, a design that uniformly raises the gain over the entire band to be amplified. For example, if the output impedance matching circuit 14 is designed so that the gain becomes high at the center frequency of the band to be amplified, the gain can be made high even in the frequency at the edge of the band to be amplified. For this reason, for example, the gain can be enhanced in the case of amplifying a wideband signal.

Figure 14A:
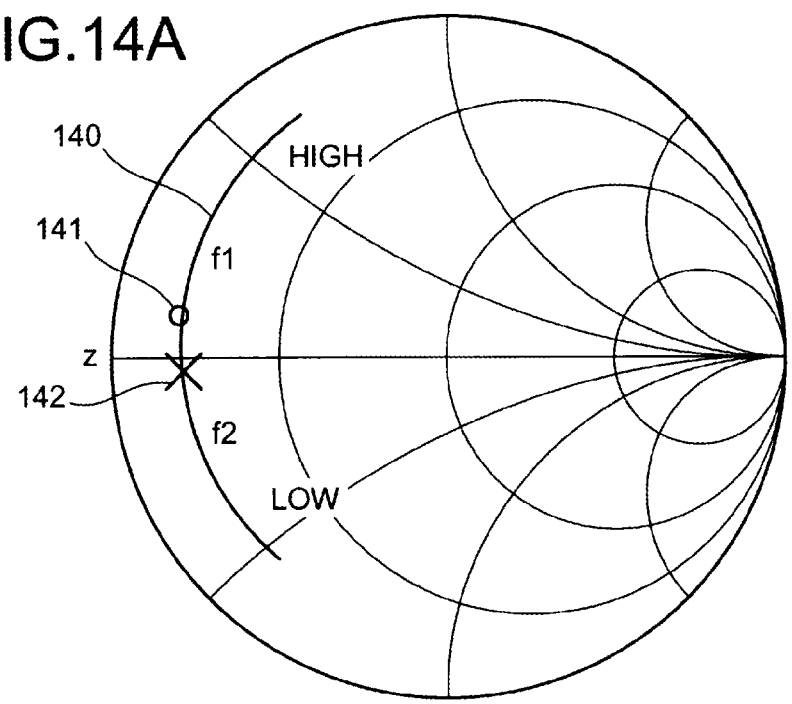
FIG. 14A depicts one example of a frequency characteristic of the load in the amplifier on an assumption that the compensating circuit is not provided.
Figure 14B:
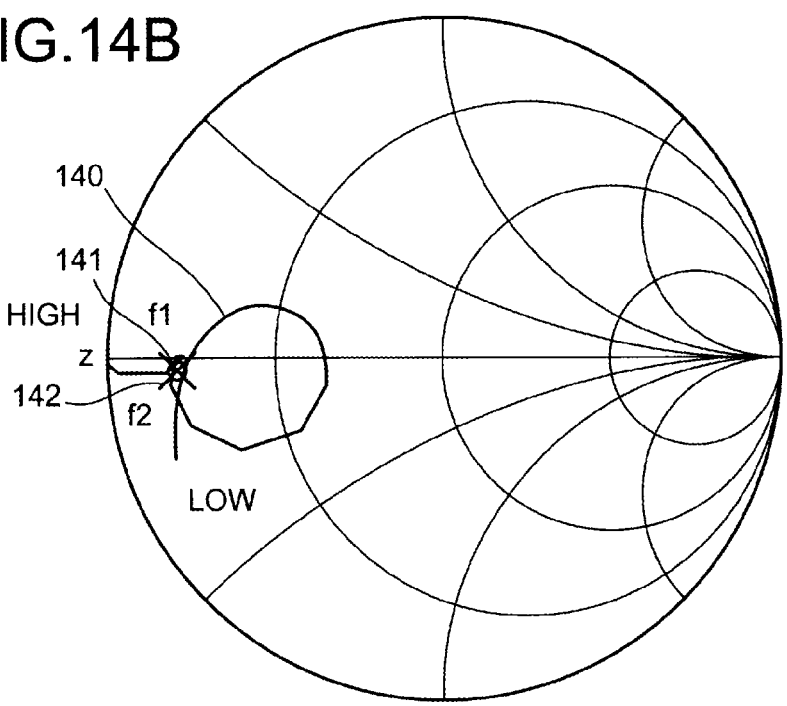
FIG. 14B depicts one example of the frequency characteristic of the load in the amplifier according to the second embodiment.

FIG. 14A depicts one example of the frequency characteristic of the load in the amplifier on the assumption that the compensating circuit is not provided. FIG. 14B depicts one example of the frequency characteristic of the load in the amplifier according to the second embodiment. FIGS. 14A and 14B depict the point of load in the amplifier 10 by the Smith chart.

In FIGS. 14A and 14B, load characteristic 140 indicates the characteristic of the load, as seen from amplifying element 13 toward the input side, relative to the frequency. A point of load 141 (o-mark) indicates the point of load indicative of the load as seen from the amplifying element 13 toward the input side, at the lower-edge frequency f1 (see FIG. 3) of the band. A point of load 142 (x-mark) indicates the point of load indicative of the load as seen from the amplifying element 13 toward the input side, at the upper-edge frequency f2 (see FIG. 3) of the band.

In the amplifier 10 on the assumption that the compensating circuit 19 is not provided, the point of load 141 at frequency f1 and the point of load 142 at frequency f2 are different points of load as depicted in FIG. 14A. In contrast, the amplifier 10 having the compensating circuit 19 can cause the point of load 141 at frequency f1 and the point of load 142 at frequency f2 to almost match as depicted in FIG. 14B.

Figure 15B:
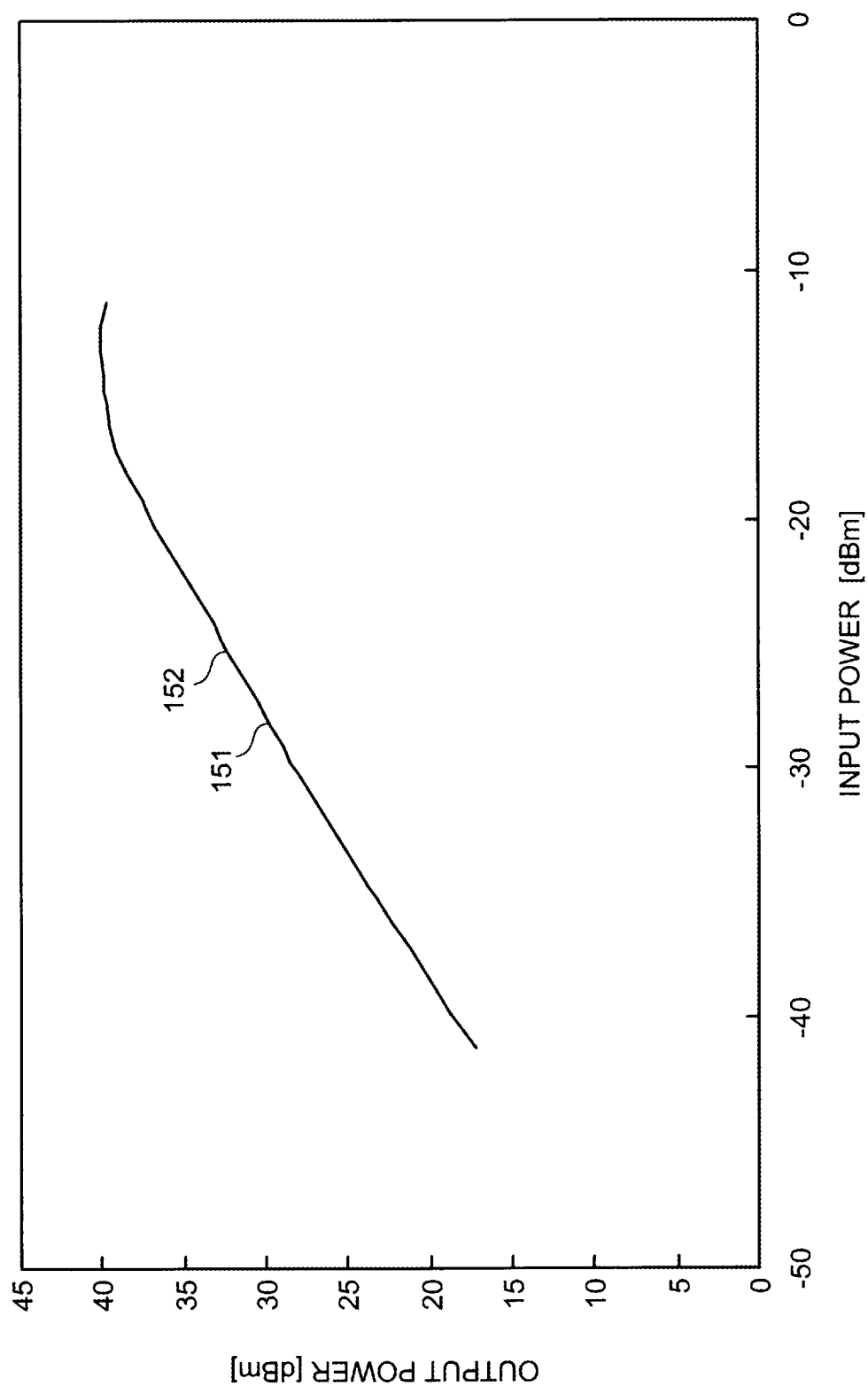
FIG. 15B depicts one example of the characteristic of the output power relative to the input power of the amplifier according to the second embodiment.

FIG. 15A depicts one example of the characteristic of the output power relative to the input power of the amplifier on the assumption that the compensating circuit is not provided. FIG. 15B depicts one example of the characteristic of the output power relative to the input power of the amplifier according to the second embodiment. The horizontal axis in FIGS. 15A and 15B represents the input power [dBm] to the amplifier 10. The vertical axis in FIGS. 15A and 15B represents the output power [dBm] from the amplifier 10.

In FIGS. 15A and 15B, the input-output characteristic 151 indicates the characteristic of the output power relative to the input power of the amplifier 10 at the center frequency of the signal to be amplified. The input-output characteristic 152 indicates the characteristic of the output power relative to the input power of the amplifier 10 at the edge (e.g., frequency f1 or frequency f2) of the band of the signal to be amplified. The ratio of the input power and the output power is the gain.

In the amplifier 10 on the assumption that the compensating circuit 19 is not provided, a gap is caused between the input-output characteristic 151 at the center frequency and the input-output characteristic 152 at the edge of the band as depicted in FIG. 15A. In contrast, the amplifier 10 having the compensating circuit 19 can cause the input-output characteristic 151 at the center frequency and the input-output characteristic 152 at the edge of the band to almost match as depicted in FIG. 15B.

Figure 16:
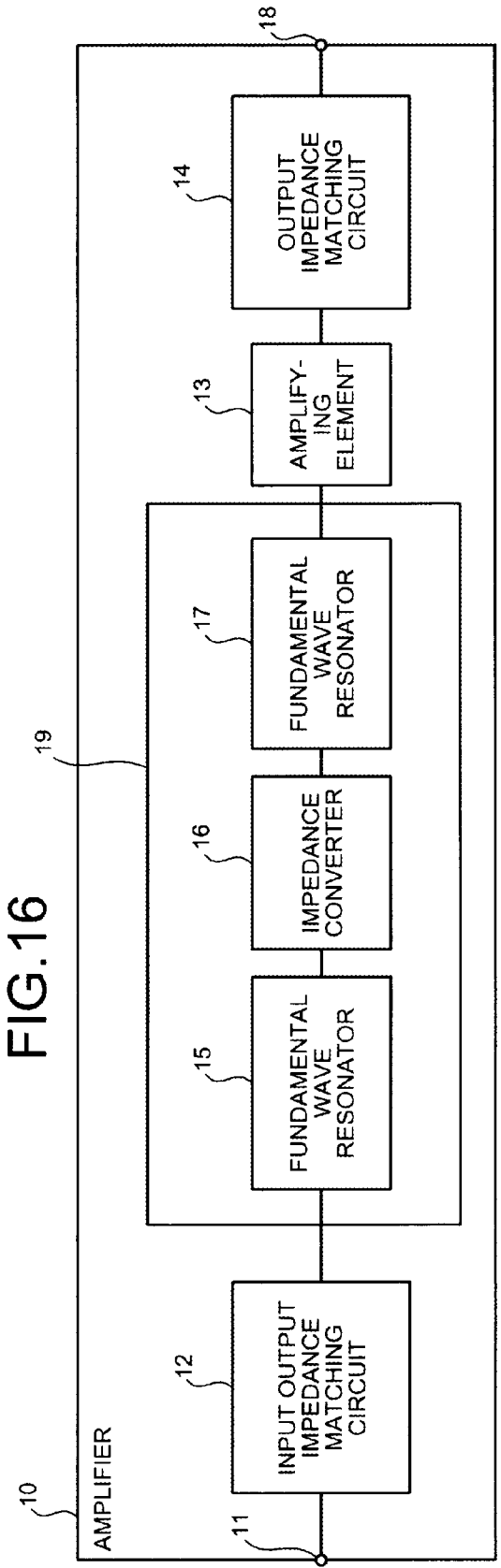
FIG. 16 depicts a variation example of the amplifier according to the second embodiment.

FIG. 16 depicts a variation example of the amplifier according to the second embodiment. In FIG. 16, parts identical to those depicted in FIG. 13 are given the same reference numerals used in FIG. 13 and description thereof is omitted. The compensating circuit 19 may be disposed between the input impedance matching circuit 12 and the amplifying element 13 as depicted in FIG. 16. Thus, even the configuration with the positions of the input impedance matching circuit 12 and the compensating circuit 19 exchanged, like the configuration depicted in FIG. 13, can achieve the equalization of the impedance relative to the frequency.

In the configuration depicted in FIG. 16, parameters of the input impedance matching circuit 12 and the impedance converter 16 to perform the impedance matching of the amplifying element 13 and the input terminal 11 can be different from those in the configuration depicted in FIG. 13.

Thus, in the amplifier 10 according to the second embodiment, the compensating circuit 19 having the fundamental wave resonators 15 and 17 disposed at the end of the impedance converter 16 is connected in series with the input impedance matching circuit 12, thereby making it possible to compensate for the frequency characteristic of the input impedance matching circuit 12 and achieve equalization of the impedance relative to the frequency.

Concerning a third embodiment, differences from the first and the second embodiments will be described.

Figure 17:
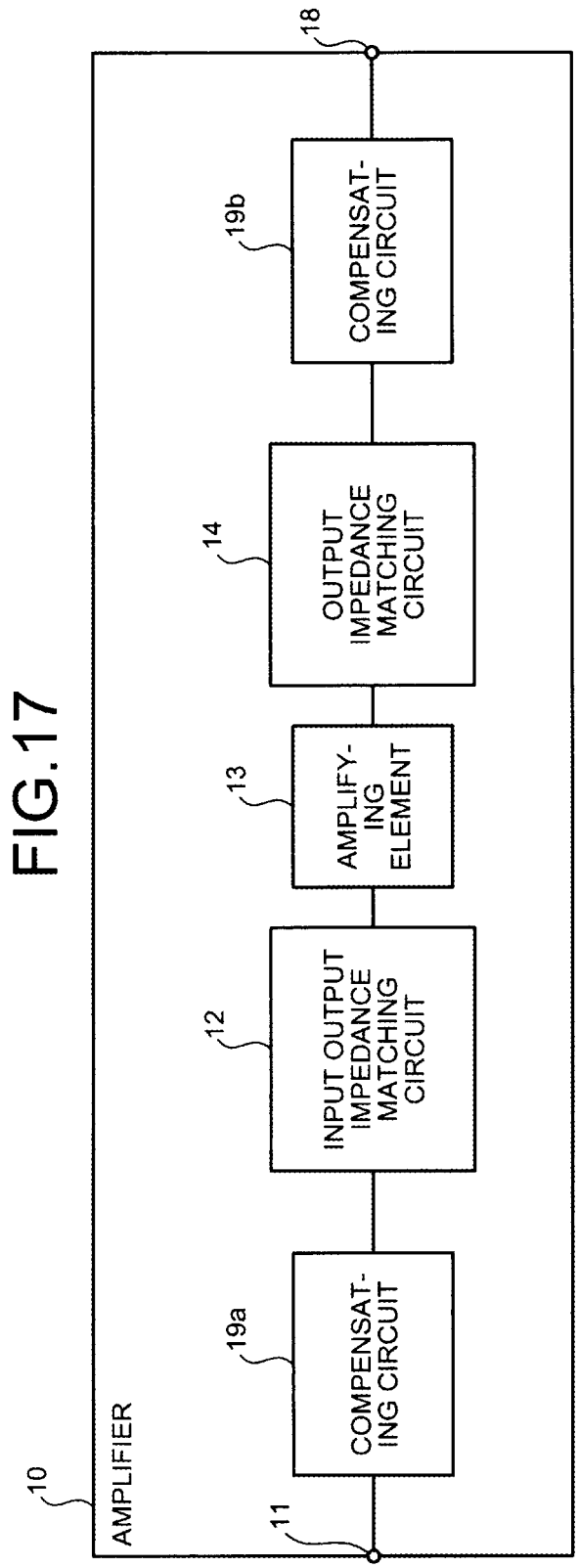
FIG. 17 depicts one example of a configuration of the amplifier according to a third embodiment.

FIG. 17 depicts one example of a configuration of the amplifier according to the third embodiment. In FIG. 17, parts identical to those depicted in FIG. 1 or 13 are given the same reference numerals used in FIGS. 1 and 13, and description thereof is omitted. As depicted in FIG. 17, the amplifier 10 according to the third embodiment has the input terminal 11, the input impedance matching circuit 12, the amplifying element 13, the output impedance matching circuit 14, the output terminal 18, and compensating circuits 19a and 19b.

The compensating circuit 19a is of the same configuration as that of the compensating circuit 19 depicted, for example, in FIG. 1. The compensating circuit 19b is of the same configuration as that of the compensating circuit 19 depicted, for example, in FIG. 13. Thus, the amplifier 10 may have both the compensating circuit 19a dealing with the input impedance matching circuit 12 and the compensating circuit 19b dealing with the output impedance matching circuit 14.

In the configuration depicted in FIG. 17, the positions of the output impedance matching circuit 14 and the compensating circuit 19b may be exchanged as in the configuration depicted in FIG. 9. In the configuration depicted in FIG. 17, the positions of the input impedance matching circuit 12 and the compensating circuit 19a may be exchanged as in the configuration depicted in FIG. 16.

Thus, the compensating circuit 19a dealing with the input impedance matching circuit 12 and the compensating circuit 19b dealing with the output impedance matching circuit 14 are disposed in the amplifier 10 according to the third embodiment, thereby making it possible to achieve the equalization of efficiency in the band to be amplified and the equalization of the gain in the band to be amplified.

Variation examples will be described of the embodiments described above.

Figure 18:
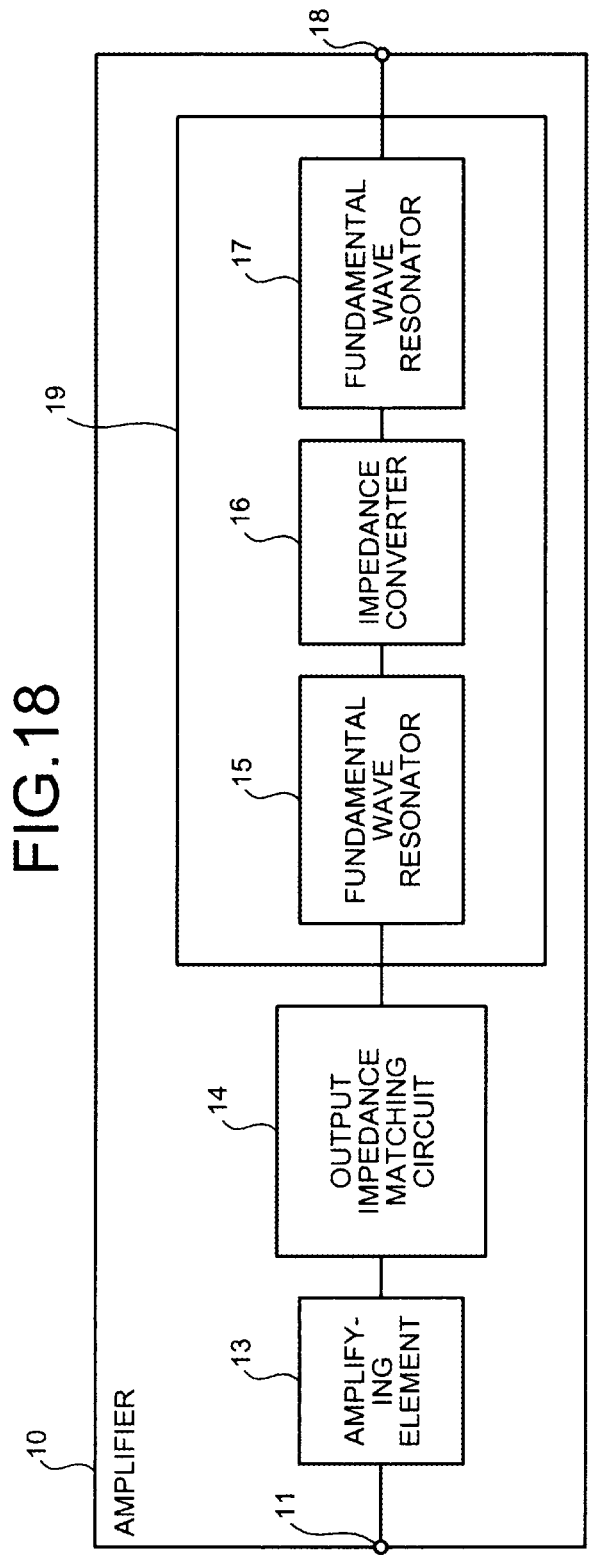
FIG. 18 depicts a variation example 1 of the amplifier.

FIG. 18 depicts a variation example 1 of the amplifier. In FIG. 18, parts identical to those depicted in FIG. 1 are given the same reference numerals used in FIG. 1 and description thereof is omitted. The amplifier 10 according to the first embodiment may have the configuration with the input impedance matching circuit 12 omitted as depicted in FIG. 18. The configuration depicted in FIG. 18 can be used, for example, when the impedance in the input terminal 11 and the impedance in the amplifying element 13 match or when a difference between the impedance in the input terminal 11 and the impedance in the amplifying element 13 is within an allowable range. The configuration depicted in FIG. 18 can achieve equalization of the efficiency in the band to be amplified.

Figure 19:
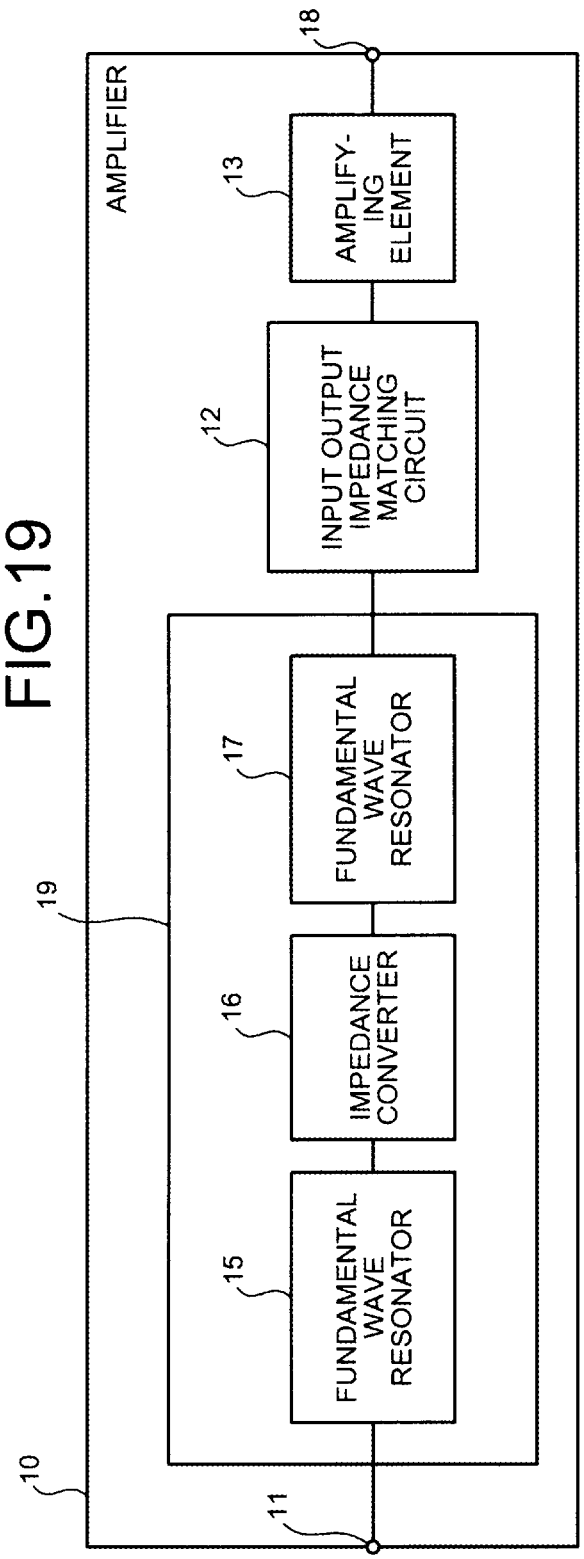
FIG. 19 depicts a variation example 2 of the amplifier.

FIG. 19 depicts a variation example 2 of the amplifier. In FIG. 19, parts identical to those depicted in FIG. 13 are given the same reference numerals used in FIG. 13 and description thereof is omitted. The amplifier 10 according to the second embodiment may have the configuration with the output impedance matching circuit 14 omitted as depicted in FIG. 19. The configuration depicted in FIG. 19 can be used, for example, when the impedance in the amplifying element 13 and the impedance in the output terminal 18 match or when a difference between the impedance in the amplifying element 13 and the impedance in the output terminal 18 is within an allowable range. The configuration depicted in FIG. 19 can achieve equalization of the gain in the band to be amplified.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An amplifier comprising:
an amplifying element that amplifies an input signal;
an output terminal that outputs the signal amplified by the amplifying element;
a matching circuit disposed in series between the amplifying element and the output terminal, and performing impedance matching;
an impedance converter disposed in series between the amplifying element and the matching circuit or between the matching circuit and the output terminal; and
a first resonator and a second resonator connected at the ends of the impedance converter, wherein
the resonance frequency of any one among the first resonator and the second resonator is lower than the center frequency of the signal, and
the resonance frequency of the other among the first resonator and the second resonator is higher than the center frequency of the signal.

2. The amplifier according to claim 1, wherein
the first resonator is connected in series upstream from the impedance converter or connected in parallel downstream from the impedance converter, and
the second resonator is connected in series downstream from the impedance converter or connected in parallel upstream from the impedance converter.

3. The amplifier according to claim 1, wherein
the resonance frequency of any one among the first resonator and the second resonator is a frequency in the vicinity of a lower edge of a band of the signal, and
the resonance frequency of the other among the first resonator and the second resonator is a frequency in the vicinity of a higher edge of the band of the signal.

4. The amplifier according to claim 1, wherein
the impedance converter is a transmission line of a length equal to a quarter of the center wavelength of the signal.

5. The amplifier according to claim 1, wherein
$Z2=Z0^2/Z1$ is true, where characteristic impedance of the impedance converter is Z0, a load connected to one end of the impedance converter is Z1, and the impedance of the impedance converter as seen from the other end of the impedance converter is Z2.

6. The amplifier according to claim 1, wherein
at least any one among the first resonator and the second resonator is a parallel resonance circuit connected in parallel at the end of the impedance converter and has a terminal to which a power source is supplied.

7. The amplifier according to claim 1, wherein
the amplifier is an outphasing amplifier.

8. The amplifier according to claim 1, wherein
the amplifier is a Doherty amplifier.

9. The amplifier according to claim 1, wherein
the impedance converter is disposed between the matching circuit and the output terminal, and
the matching circuit performs the impedance matching of the amplifying element and the impedance converter.

10. The amplifier according to claim 1, wherein
the impedance converter is disposed between the amplifying element and the matching circuit, and
the matching circuit performs the impedance matching of the impedance converter and the output terminal.

11. An amplifier comprising:
an input terminal to which a signal is input;
an amplifying element that amplifies the signal input from the input terminal;
a matching circuit disposed in series between the input terminal and the amplifying element, and performing impedance matching;
an impedance converter disposed in series between the input terminal and the matching circuit or between the matching circuit and the amplifying element; and
a first resonator and a second resonator connected at the ends of the impedance converter, wherein
the resonance frequency of any one among the first resonator and the second resonator is lower than the center frequency of the signal, and
the resonance frequency of the other among the first resonator and the second resonator is higher than the center frequency of the signal.

12. An amplifier comprising:
an input terminal to which a signal is input;
an amplifying element that amplifies the signal input from the input terminal;
an output terminal that outputs the signal amplified by the amplifying element;
a first matching circuit disposed in series between the input terminal and the amplifying element, and performing impedance matching;
a first impedance converter disposed in series between the input terminal and the first matching circuit or between the first matching circuit and the amplifying element;
a first resonator and a second resonator connected at an end of the first impedance converter;
a second matching circuit disposed in series between the amplifying element and the output terminal, and performing the impedance matching;
a second impedance converter disposed in series between the amplifying element and the second matching circuit or between the second matching circuit and the output terminal; and
a third resonator and a fourth resonator connected at an end of the second impedance converter.

* * * * *